(12) United States Patent
Konishi et al.

(10) Patent No.: US 11,621,321 B2
(45) Date of Patent: Apr. 4, 2023

(54) SEMICONDUCTOR DEVICE

(71) Applicant: Mitsubishi Electric Corporation, Tokyo (JP)

(72) Inventors: Kazuya Konishi, Tokyo (JP); Tetsuya Nitta, Tokyo (JP); Tomohiro Tamaki, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 17/354,495

(22) Filed: Jun. 22, 2021

(65) Prior Publication Data

US 2022/0216299 A1    Jul. 7, 2022

(30) Foreign Application Priority Data

Jan. 7, 2021 (JP) .............................. JP2021-001656

(51) Int. Cl.
*H01L 29/06* (2006.01)
*H01L 27/06* (2006.01)
(Continued)

(52) U.S. Cl.
CPC .... *H01L 29/0634* (2013.01); *H01L 21/26513* (2013.01); *H01L 21/26546* (2013.01); *H01L 21/761* (2013.01); *H01L 21/7602* (2013.01); *H01L 21/7605* (2013.01); *H01L 27/0664* (2013.01); *H01L 29/1095* (2013.01); *H01L 29/1602* (2013.01); *H01L 29/1608* (2013.01);
(Continued)

(58) Field of Classification Search
CPC ......... H01L 21/26513; H01L 21/26546; H01L 21/7602; H01L 21/7605; H01L 21/761; H01L 27/0664; H01L 29/0634; H01L 29/1095; H01L 29/1602; H01L 29/1608; H01L 29/2003; H01L 29/7397; H01L 29/7813
USPC .......................................................... 257/77
See application file for complete search history.

(56) References Cited

U.S. PATENT DOCUMENTS

2017/0263757 A1\* 9/2017 Saikaku ............... H01L 29/1608
2018/0076285 A1\* 3/2018 Tanaka ................ H01L 29/0623
(Continued)

FOREIGN PATENT DOCUMENTS

| JP | 2018-207101 A | 12/2018 |
| JP | 2019-197792 A | 11/2019 |
| WO | 2016/157606 A1 | 10/2016 |

*Primary Examiner* — Igwe U Anya
(74) *Attorney, Agent, or Firm* — Studebaker & Brackett PC

(57) ABSTRACT

According to one aspect of the present disclosure, a semiconductor device includes a substrate; a drift layer of a first conductivity type provided on the substrate; a base layer of a second conductivity type provided above the drift layer on the substrate; a source layer of the first conductivity type provided on an upper surface side of the base layer; a first electrode electrically connected to the source layer; a second electrode provided on the rear surface of the substrate; a gate electrode; a trench gate extending from an upper surface of the substrate to the drift layer; and a first bottom layer of the second conductivity type provided below the trench gate in the drift layer, wherein a first distance between a portion of the first bottom layer where an impurity concentration peaks in a thickness direction and the trench gate is larger than 1 μm.

49 Claims, 28 Drawing Sheets

(51) Int. Cl.
*H01L 29/10* (2006.01)
*H01L 29/16* (2006.01)
*H01L 29/20* (2006.01)
*H01L 21/761* (2006.01)
*H01L 29/78* (2006.01)
*H01L 21/265* (2006.01)
*H01L 21/76* (2006.01)
*H01L 29/739* (2006.01)

(52) U.S. Cl.
CPC ...... *H01L 29/2003* (2013.01); *H01L 29/7397* (2013.01); *H01L 29/7813* (2013.01)

(56) References Cited

U.S. PATENT DOCUMENTS

| | | |
|---|---|---|
| 2018/0358429 A1* | 12/2018 | Tanaka ................ H01L 29/1608 |
| 2018/0358454 A1 | 12/2018 | Okumura |
| 2019/0348524 A1 | 11/2019 | Ebiike et al. |

* cited by examiner

SEMICONDUCTOR DEVICE

BACKGROUND OF THE INVENTION

Field

The present disclosure relates to a semiconductor device.

Background

WO 2016-157606 A discloses a semiconductor device. In the semiconductor device, a drift layer of a first conductivity type is made of silicon carbide. A body region of a second conductivity type is provided on the drift layer. A source region of the first conductivity type is provided on the body region. A source electrode is connected to the source region. A gate insulating film is provided on the side surfaces and the bottom surface of a trench that passes through the body region and the source region. A gate electrode is provided inside the trench via the gate insulating film. A trench-bottom protective layer of the second conductivity type is provided below the bottom surface of the trench within the drift layer and is electrically connected to the source electrode. The trench-bottom protective layer has a high-concentration protective layer and a first low-concentration protective layer that is provided below the high-concentration protective layer and having a lower impurity concentration than that of the high-concentration protective layer.

In the semiconductor device of WO 2016-157606 A, the trench-bottom protective layer can relax an electric field that is applied to a gate oxide film formed at the corner of the trench where electric field concentration tends to occur. It is thus possible to prevent a decrease in the reliability of the gate oxide film. However, in the configuration of Patent Literature 1, the trench and the trench-bottom protective layer are in contact with each other. This may cause a collector-voltage tail to occur, thus increasing turn-off loss.

SUMMARY

The present disclosure has been made to solve the problem described above, and it is an object of the present disclosure to provide a semiconductor device capable of reducing a collector-voltage tail.

The features and advantages of the present disclosure may be summarized as follows.

According to one aspect of the present disclosure, a semiconductor device includes a substrate having an upper surface and a rear surface opposite to the upper surface; a drift layer of a first conductivity type provided on the substrate; a base layer of a second conductivity type different from the first conductivity type, the base layer being provided above the drift layer on the substrate; a source layer of the first conductivity type provided on an upper surface side of the base layer; a first electrode provided on the upper surface of the substrate and electrically connected to the source layer; a second electrode provided on the rear surface of the substrate; a gate electrode; a trench gate extending from the upper surface of the substrate to the drift layer through the source layer and the base layer, and electrically connected to the gate electrode or the first electrode; and a first bottom layer of the second conductivity type provided below the trench gate in the drift layer, wherein a first distance between a portion of the first bottom layer where an impurity concentration peaks in a thickness direction and the trench gate is larger than 1 μm.

Other and further objects, features and advantages of the disclosure will appear more fully from the following description.

DESCRIPTION OF EMBODIMENTS

Figure 1:
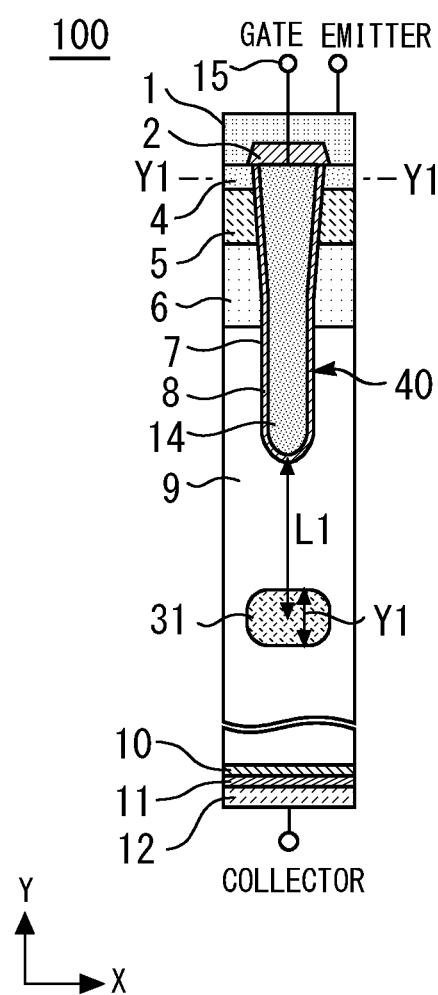
FIG. 1 is a cross-sectional view of a semiconductor device according to a first embodiment.

A semiconductor device according to each embodiment will be described with reference to the drawings. The same or corresponding components are denoted by the same reference numerals, and repetition of the description may be omitted. In the following description, n and p each represent a conductivity type of a semiconductor. In the present disclosure, a first conductivity type will be described as n type, and a second conductivity type will be described as p type, but the first conductivity type may be p type, and the second conductivity type may be n type. In addition, n– indicates that the impurity concentration is lower than that of n, and n+ indicates that the impurity concentration is higher than that of n. Similarly, p– indicates that the impurity concentration is lower than that of p, and p+ indicates that the impurity concentration is higher than that of p.

First Embodiment

Figure 2:
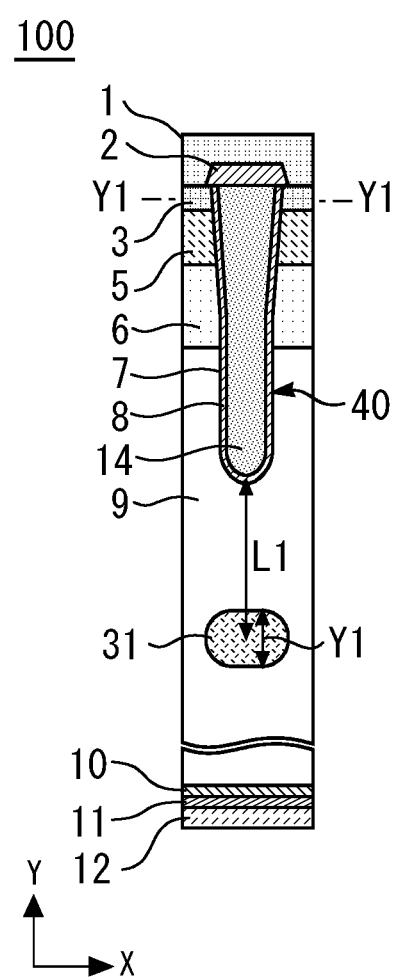
FIG. 2 is another cross-sectional view of the semiconductor device according to the first embodiment.
Figure 3:
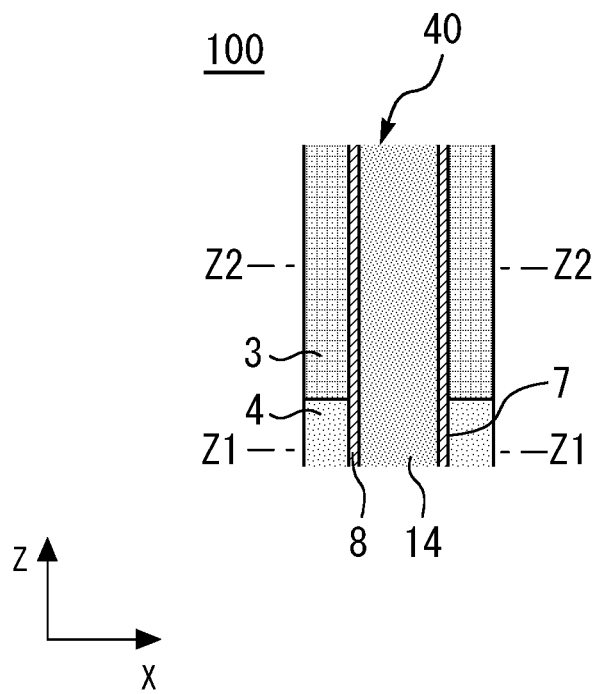
FIG. 3 is a cross-sectional view obtained by cutting each of FIGS. 1 and 2 along a line Y1-Y1.

FIG. 1 is a cross-sectional view of a semiconductor device 100 according to a first embodiment. FIG. 2 is another cross-sectional view of the semiconductor device 100 according to the first embodiment. FIG. 3 is a cross-sectional view obtained by cutting each of FIGS. 1 and 2 along a line Y1-Y1. Note that FIG. 1 is a cross-sectional view obtained by cutting FIG. 3 along a line Z1-Z1, and FIG. 2 is a cross-sectional view obtained by cutting FIG. 3 along a line Z2-Z2. The semiconductor device 100 is, for example, an insulated-gate bipolar transistor (IGBT).

The semiconductor device 100 includes a substrate having an upper surface and a rear surface opposite to the upper surface. The substrate ranges from an n+ type source layer 4 to a p type collector layer 11 in FIG. 1. Hereinafter, the upper surface of the source layer 4 may be referred to as a first main surface, and the lower surface of the collector layer 11 may be referred to as a second main surface. The first main surface is the upper surface of the substrate, and the second main surface is the rear surface of the substrate.

The substrate is provided with an n– type drift layer 9. The n type impurity concentration in the drift layer 9 is, for example, $10^{12}/cm^3$ to $10^{15}/cm^3$. The n– type drift layer 9 has, for example, arsenic or phosphorus as n type impurities.

An n type carrier accumulation layer 6 having a higher n type impurity concentration than that of the drift layer 9 is provided on the first main surface side of the drift layer 9. The carrier accumulation layer 6 has, for example, arsenic or phosphorus as n type impurities. The n type impurity concentration in the carrier accumulation layer 6 is, for example, $10^{13}/cm^3$ to $10^{17}/cm^3$.

Note that the carrier accumulation layer 6 may not be provided, and the drift layer 9 may be provided also in the region of the carrier accumulation layer 6. By providing the carrier accumulation layer 6, conduction loss can be reduced when a current flows through the semiconductor device 100. The carrier accumulation layer 6 and the drift layer 9 may be collectively referred to as a drift layer.

At the time of forming the carrier accumulation layer 6, first, n type impurities are ion-implanted into the substrate on which the drift layer 9 is formed. Thereafter, the implanted n type impurities are diffused into the drift layer 9 by annealing.

A p type base layer 5 is provided on the first main surface side of the carrier accumulation layer 6. The base layer 5 has, for example, boron or aluminum as p type impurities. The p type impurity concentration in the base layer 5 is, for example, $10^{12}/cm^3$ to $10^{19}/cm^3$. The p type base layer 5 is in contact with a gate oxide film 8 of an active trench gate 40.

On the first main surface side of the base layer 5, the n+ type source layer 4 is provided in contact with the gate oxide film 8 of the active trench gate 40. The source layer 4 has, for example, arsenic or phosphorus as n type impurities. The n type impurity concentration in the source layer 4 is, for example, $10^{17}/cm^3$ to $10^{20}/cm^3$.

A p+ type contact layer 3 is provided in the region, except for the source layer 4, on the uppermost surface of the substrate. The source layer 4 and the contact layer 3 constitute the first main surface of the substrate. Note that the contact layer 3 has a higher p type impurity concentration than that of the base layer 5.

In the semiconductor device 100, an n type buffer layer 10, which has a higher n type impurity concentration than that of the drift layer 9, is provided on the second main surface side of the drift layer 9. The buffer layer 10 is provided to prevent a depletion layer, which extends from the base layer 5 to the second main surface side, from punching through when the semiconductor device 100 is in an off state. The buffer layer 10 is formed by implanting, for example, phosphorus or protons. The buffer layer 10 may be formed by implanting both phosphorus and protons.

Note that the buffer layer 10 may not be provided, and the drift layer 9 may be provided also in the region of the buffer layer 10. The buffer layer 10 and the drift layer 9 may be collectively referred to as a drift layer.

The p type collector layer 11 is provided on the second main surface side of the buffer layer 10. That is, the collector layer 11 is provided between the drift layer 9 and the second main surface.

The semiconductor device 100 includes the active trench gate 40. The active trench gate 40 extends from the upper surface of the substrate to the drift layer 9 through the contact layer 3, the source layer 4, the base layer 5, and the carrier accumulation layer 6. The active trench gate 40 is electrically connected to a gate electrode 15. The gate electrode 15 is formed on the upper surface of the substrate. The active trench gate 40 is constituted by providing an active portion 14 in a trench 7 formed in the substrate via the gate oxide film 8. The active portion 14 is electrically connected to the gate electrode 15.

The active trench gate 40 and a dummy trench gate 41 to be described later may be provided in a stripe shape. The active trench gate 40 and the dummy trench gate 41 may be arranged alternately. A set of active trench gates 40 and a set of dummy trench gates 41 may be arranged alternately. The number of active trench gates 40 included in one set of active trench gates 40 may be one or more. Likewise, the number of the dummy trench gates 41 included in one set of the dummy trench gates 41 may be one or more. For example, a set in which three active trench gates 40 are arranged and a set in which three dummy trench gates 41 are arranged may be arranged alternately. One active trench gate 40 and a set of five dummy trench gates 41 arranged may be arranged alternately. The number of dummy trench gates 41 may be 0. That is, all of the trench gates provided in the semiconductor device 100 may be the active trench gates 40.

The base layer 5 in contact with the active trench gate 40 is connected to an emitter electrode 1 via the contact layer 3. The base layer 5 may or may not contact the emitter electrode 1 between the active trench gate 40 and the dummy trench gate 41 or between the dummy trench gate 41 and the dummy trench gate 41.

A p type first bottom layer 31 is provided below the active trench gate 40 in the drift layer 9. The first bottom layer 31 is provided so as not to contact the bottom of the trench 7. The first bottom layer 31 is separated from the active trench gate 40.

Figure 4:
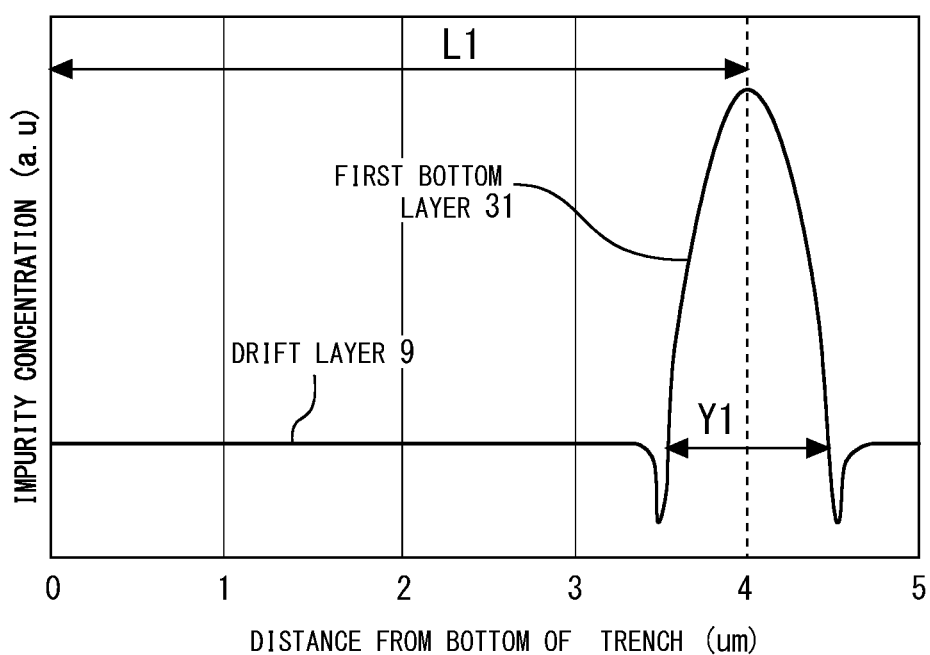
FIG. 4 is a diagram for explaining the impurity concentration according to the first embodiment.

FIG. 4 is a diagram for explaining the impurity concentration according to the first embodiment. FIG. 4 illustrates the relationship between the distance from the bottom of the trench 7 and the impurity concentration. The first distance L1 is a distance between a portion of the first bottom layer 31 in which the impurity concentration peaks in the thickness direction and the active trench gate 40. In the present embodiment, L1>1 µm.

Y1 is the thickness of the first bottom layer 31. A concentration profile may draw a tail depending on a certain condition. In this case, the thickness of the first bottom layer 31 ignoring the tail portion is assumed to be Y1. In addition, two or more bottom layers may be provided and overlap each other. In this case, Y1×½ is obtained using the concentration profile from the first concentration peak from the bottom of the trench 7 to the trench 7 side. Y1 can be calculated by doubling Y1×½.

The first bottom layer 31 has, for example, boron or aluminum as p type impurities. The p type impurity concentration in the first bottom layer 31 is $10^{15}/cm^3$ to $10^{18}/cm^3$. More preferably, the concentration is $5.0×10^{15}/cm^3$ to $5.0×10^{17}/cm^3$. Further preferably, the concentration is $10^{16}/cm^3$ to $5.0×10^{16}/cm^3$.

An interlayer insulating film 2 is provided on the active portion 14 of the active trench gate 40. The emitter electrode 1 is provided on a region of the first main surface of the substrate where the interlayer insulating film 2 is not provided, and on the interlayer insulating film 2. The emitter electrode 1 corresponds to the first electrode. The emitter electrode 1 is in ohmic contact with the source layer 4 and the contact layer 3 and is electrically connected to the source layer 4, the contact layer 3, and a dummy portion 13 of the dummy trench gate 41.

The emitter electrode 1 may be formed of, for example, an aluminum alloy such as an Al—Si-based alloy. The emitter electrode 1 may be an electrode made up of a plurality of metal films. In the electrode made up of a plurality of metal films, a plating film is formed on an electrode formed of, for example, an aluminum alloy. The plating film is formed by electroless plating or electrolytic plating. The plating film is, for example, a nickel-plating film.

Further, there is a possibility that the emitter electrode 1 cannot be satisfactorily embedded in a fine region, such as between adjacent interlayer insulating films 2. In this case, tungsten having a better embeddability than that of the emitter electrode 1 may be disposed in the fine region, and the emitter electrode 1 may be provided on the tungsten.

A barrier metal may be provided between the interlayer insulating film 2 and the emitter electrode 1. The barrier metal is, for example, a conductor containing titanium. The barrier metal is, for example, titanium nitride or TiSi formed by alloying titanium and silicon. The barrier metal may be provided only on the n type semiconductor layer such as the source layer 4. The barrier metal and the emitter electrode 1 may be collectively referred to as an emitter electrode.

A collector electrode 12 is provided on the second main surface side of the collector layer 11. The collector electrode 12 corresponds to the second electrode. The collector electrode 12 may be formed of an aluminum alloy, or an aluminum alloy and a plating film, in the same manner as the emitter electrode 1. The configuration of the collector electrode 12 may be different from the configuration of the emitter electrode 1. The collector electrode 12 is in ohmic contact with the collector layer 11 and is electrically connected to the collector layer 11. In the semiconductor device 100, when a voltage is applied to the gate electrode 15, a current flows from the second electrode to the first electrode.

Next, an example of a method for manufacturing the semiconductor device 100 according to the first embodiment will be described. First, the substrate is prepared. As the substrate, for example, a so-called FZ wafer produced by the floating zone (FZ) method or a so-called MCZ wafer produced by the magnetic field applied Czochralski (MCZ) method is used. The substrate may be an n type wafer containing n type impurities. The concentration of the n type impurities contained in the substrate is appropriately selected in accordance with the withstand voltage of the semiconductor device 100 to be produced. For example, in the semiconductor device 100 having a withstand voltage of 1200 V, the n type impurity concentration is adjusted so that the specific resistance of the drift layer 9 is about 40 to 120 Ω·cm.

In the step of preparing the substrate, the entire substrate is the drift layer 9. P type or n type impurity ions are implanted from the first main surface side or the second main surface side of the substrate and then diffused into the substrate by thermal treatment or the like to form a p type or n type semiconductor layer. Thus, the semiconductor device 100 is manufactured.

Although not illustrated, a terminal region is provided around a cell region. A method for manufacturing the cell region will be mainly described below. The terminal region may be produced by a known manufacturing method. For example, a field limiting ring (FLR) having a p type terminal well layer as a withstand voltage holding structure may be formed in the terminal region. The FLR may be formed by implanting p type impurity ions before the cell region is processed. The FLR may be formed by implanting p type impurity ions simultaneously when p type impurity ions are implanted into the cell region.

Next, n type impurities such as phosphorus are implanted from the first main surface side of the substrate to form the carrier accumulation layer 6. P type impurities such as boron are implanted from the first main surface side of the substrate to form the base layer 5. The carrier accumulation layer 6 and the base layer 5 are formed by implanting impurity ions into the substrate and then diffusing the impurity ions by thermal treatment. The n type impurities and the p type impurities are ion-implanted after a masking process is performed on the first main surface of the substrate. Therefore, the carrier accumulation layer 6 and the base layer 5 are selectively formed on the first main surface side of the substrate. The carrier accumulation layer 6 and the base layer 5 are formed in the cell region and connected to the terminal well layer in the terminal region.

In the masking process, a resist is applied onto the substrate, and an opening is formed in a predetermined region of the resist by using photoengraving. This enables ion implantation or etching to be performed in the predetermined region of the substrate via the opening.

Next, n type impurities are selectively implanted into the first main surface side of the base layer 5 by the masking process to form the source layer 4. The n type impurities to be implanted are, for example, arsenic or phosphorus. Note that the n type impurities may be implanted using the same mask as the mask used for forming the base layer 5, thereby forming the source layer 4. Thus, the number of masks can be reduced, and the manufacturing cost can be reduced.

Subsequently, the trench 7 is formed, which penetrates through the base layer 5 from the first main surface side of the substrate and reaches the drift layer 9. In the step of forming the trench 7, first, an oxide film such as $SiO_2$ is deposited on the substrate. Next, an opening is formed in a portion of the oxide film where the trench 7 is formed by the masking process. Then, the substrate is etched using the oxide film having the opening as a mask.

Figure 5:
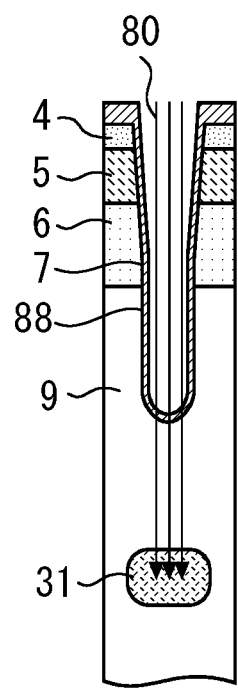
FIG. 5 is a diagram illustrating the method for manufacturing the semiconductor device according to the first embodiment.

Next, the substrate is heated in an atmosphere containing oxygen. Thus, an oxide film 88 is formed inside the trench 7 and on the first main surface of the substrate. FIG. 5 is a diagram illustrating the method for manufacturing the semiconductor device 100 according to the first embodiment. FIG. 5 illustrates a state where the oxide film 88 is formed. The oxide film 88 formed on the first main surface of the substrate is removed in a later step.

Next, as indicated by an arrow 80 in FIG. 5, p type impurities such as boron or aluminum are implanted below the trench 7 from the first main surface side of the substrate to form the first bottom layer 31. After the impurity ions are implanted into the substrate, the impurity ions are diffused by thermal treatment. For this thermal treatment, thermal treatment for forming the gate oxide film 8 in a later step may be used.

In order to form the first bottom layer 31 at a deep position below the trench 7, high-energy ion implantation of several MeV may be performed. At this time, the implantation is performed via the oxide film 88, so that the implantation damage to the surface of the semiconductor layer can be reduced. Further, the implantation into the sidewall of the semiconductor layer forming the trench 7 can be prevented.

Next, the substrate is heated in an atmosphere containing oxygen to form the gate oxide film 8 inside the trench 7 and on the first main surface of the substrate. The gate oxide film 8 formed on the first main surface of the substrate is removed in a later step.

Next, polysilicon doped with n type or p type impurities is deposited on the gate oxide film 8 in the trench 7. Polysilicon is deposited by chemical vapor deposition (CVD) or the like. Thus, the active portion 14 is formed.

Next, the interlayer insulating film 2 is formed on the active trench gate 40. The interlayer insulating film 2 is deposited using, for example, the masking process. The interlayer insulating film 2 is, for example, $SiO_2$. Next, the contact layer 3 is formed. Thereafter, the gate oxide film 8 formed on the upper surface of the substrate is removed. Then, a contact hole is formed in the interlayer insulating film 2. The contact hole is formed on the source layer 4 and the contact layer 3.

Next, the emitter electrode 1 is formed on the first main surface of the substrate and the interlayer insulating film 2. The emitter electrode 1 is formed by depositing an Al—Si-based alloy by physical vapor deposition (PVD) such as sputtering or vapor deposition. The emitter electrode 1 may further have a nickel alloy formed on an aluminum-silicon alloy. The nickel alloy is formed, for example, by electroless plating or electrolytic plating. Note that the plating process for forming the nickel alloy may be performed after the second main surface side of the substrate is processed. By forming the emitter electrode 1 by plating, a thick metal film can be easily formed as the emitter electrode 1. Hence the heat capacity of the emitter electrode 1 can be increased to improve the heat resistance.

Next, the second main surface side of the substrate is ground to thin the substrate to a designed thickness. The thickness of the substrate after the grinding is, for example, 80 μm to 200 μm.

Next, n type impurities are implanted from the second main surface side of the substrate to form the buffer layer 10. Further, p type impurities are implanted from the second main surface side of the substrate to form the collector layer 11. The buffer layer 10 is formed by implanting, for example, phosphorus ions or protons. The buffer layer 10 may be formed by implanting both protons and phosphorus. Protons can be implanted from the second main surface of the substrate to a deep position at a relatively low acceleration energy. By changing the acceleration energy, the depth to which the protons are implanted can be changed easily. Therefore, by implanting protons a plurality of times while changing the acceleration energy, it is possible to form the buffer layer 10 having a larger width in the thickness direction of the substrate than that when the layer is formed of phosphorus.

Phosphorus may be made to have a higher activation rate as the n type impurities than that of protons. Therefore, by forming the buffer layer 10 with phosphorus, the punch-through of the depletion layer can be more reliably prevented even in a substrate with a reduced thickness. For further reducing the thickness of the substrate, it is preferable to form the buffer layer 10 by implanting both protons and phosphorus. At this time, protons are implanted to a deeper position from the second main surface than phosphorus.

The collector layer 11 is formed by implanting boron, for example. In the step of forming the collector layer 11, after the ion-implantation from the second main surface side of the substrate, the second main surface is irradiated with a laser beam for laser annealing. Thereby, the implanted boron is activated. At this time, phosphorus implanted to a shallow position of the buffer layer 10 from the second main surface of the substrate is also activated simultaneously. On the other hand, protons are activated at an annealing temperature as low as 350 to 500° C. Therefore, after the implantation of protons, the temperature of the entire substrate need not be raised to a temperature higher than 350 to 500° C., except in the step for activating protons. On the other hand, in the laser annealing, the temperature only in the vicinity of the second main surface of the substrate can be made high. Thus, the laser annealing can be used to activate n type or p type impurities even after the implantation of protons.

Next, the collector electrode 12 is formed on the second main surface of the substrate. The collector electrode 12 is formed by depositing an Al—Si-based alloy, titanium, or the like, by PVD such as sputtering or vapor deposition. A plurality of metals, such as aluminum-silicon alloy, titanium, nickel, or gold, may be laminated to form the collector electrode 12. Moreover, on the metal film formed by PVD, a metal film may be further formed by electroless plating or electrolytic plating to form the collector electrode 12.

The semiconductor device 100 is manufactured by the steps as described above. A plurality of semiconductor devices 100 are formed in a matrix on one wafer. The wafer is cut into individual semiconductor devices 100 by laser dicing or blade dicing to complete the semiconductor devices 100.

In this manufacturing method, the first bottom layer 31 is formed by the implantation from the bottom of the trench 7. The manufacturing method is not limited thereto, but the first bottom layer 31 may be formed at a deep position by using a multi-epitaxy method. The multi-epitaxy method is performed by a combination of epitaxy and implantation. That is, implantation is performed in the middle of epitaxy, and the epitaxy is performed again after the implantation.

Figure 6:
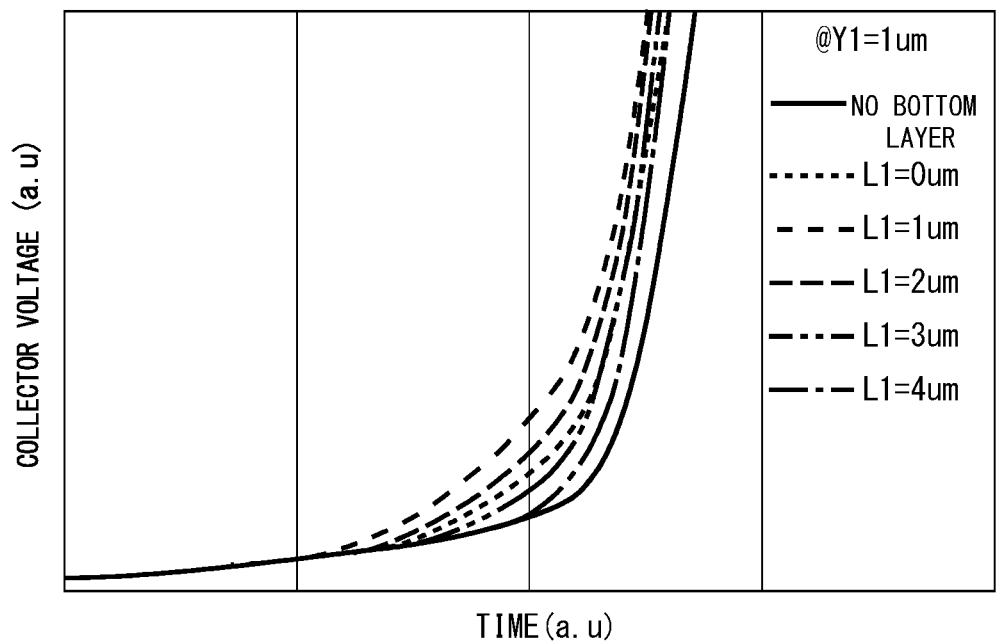
FIG. 6 is a diagram illustrating the relationship between the first distance and the collector-voltage tail.

FIG. 6 is a diagram illustrating the relationship between the first distance L1 and the collector-voltage tail. FIG. 6 illustrates a collector voltage waveform at the time of turn-off. Here, the thickness Y1 of the first bottom layer 31 is set to 1 μm. The inventor has found that when the first bottom layer 31 is located below the trench 7, the rise of the collector voltage at the time of turn-off is not steep. That is, with the collector voltage rising gently, a collector-voltage tail occurs, and the collector voltage at the rise of the collector voltage becomes high. This may cause an increase in turn-off loss.

In particular, when the first distance L1 is 1 μm, the collector-voltage tail becomes the largest. When the first distance L1 is made larger than 1 μm, the collector-voltage tail decreases. When L1=0 μm, the first bottom layer 31 overlaps the trench 7. Thus, the volume of the first bottom layer 31 decreases, and the collector-voltage tail decreases.

Figure 7:
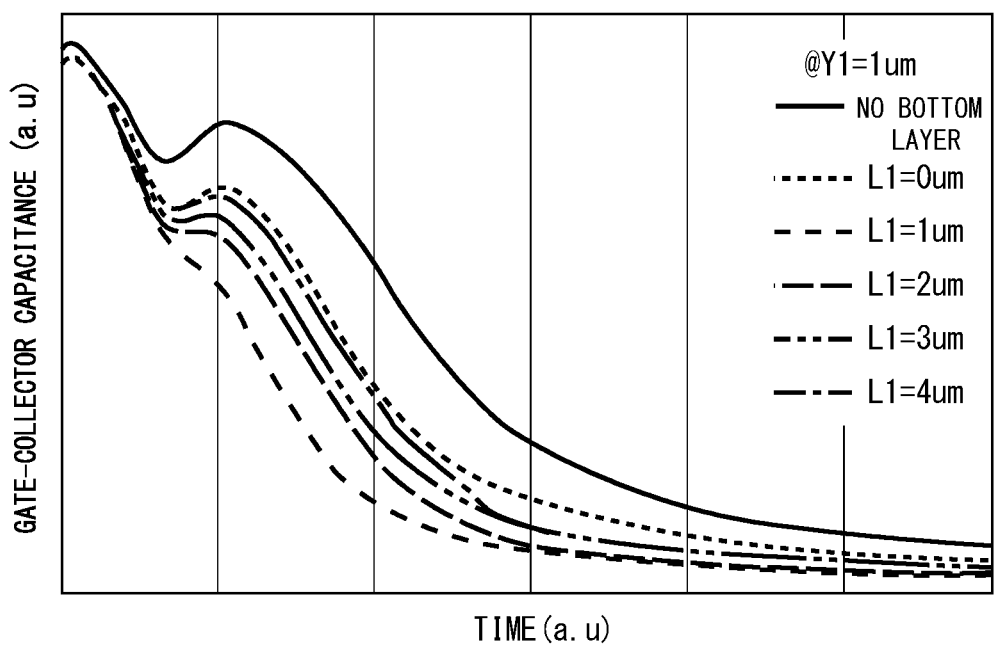
FIG. 7 is a diagram illustrating the relationship between the first distance and the gate-collector capacitance.

The collector-voltage tail occurs because the first bottom layer 31 affects a gate-collector capacitance Cgc. FIG. 7 is a diagram illustrating the relationship between the first distance L1 and the gate-collector capacitance Cgc. As illustrated in FIG. 7, the presence of the first bottom layer 31 increases a drop in the gate-collector capacitance Cgc. A sudden drop in the gate-collector capacitance Cgc occurs because the depletion layer generated from the active trench gate 40 contacts the depletion layer of the first bottom layer 31, and the depletion layer becomes longer.

Figure 8:
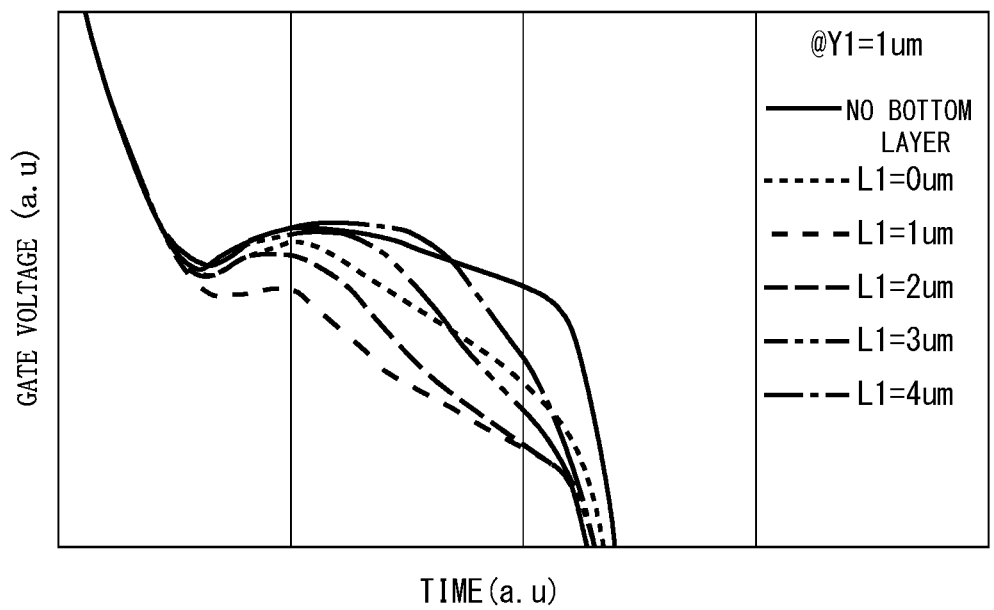
FIG. 8 is a diagram illustrating the relationship between the first distance and a gate voltage.

FIG. 8 is a diagram illustrating the relationship between the first distance L1 and a gate voltage Vge. FIG. 8 illustrates the waveform of the gate voltage Vge at the time of turn-off. By the gate-collector capacitance Cgc becoming small due to the influence of the first bottom layer 31, the drop in the gate voltage increases. At this time, the collector current is being supplied. The decrease in the gate voltage reduces the supply of electron current from the channel. As a result, the carrier concentration decreases, and the resistance increases. This increases the collector voltage to keep the collector current. This increase in the collector voltage becomes a collector-voltage tail.

In order to reduce the collector-voltage tail, it is effective to increase the distance between the trench 7 and the first bottom layer 31 and reduce the drop in the gate-collector capacitance Cgc. The semiconductor device 100 according to the first embodiment has been manufactured based on the above knowledge of the inventor.

In the present embodiment, the first bottom layer 31 is disposed so as to satisfy a relationship of L1>1 μm. As illustrated in FIG. 6, when the first distance L1 is larger than 1 μm, the collector-voltage tail can be reduced more than when the first distance L1 is 1 μm. Therefore, the turn-off loss can be reduced. Also, by separating the trench 7 and the first bottom layer 31 so as not to contact each other, the effect of reducing the collector-voltage tail can be obtained.

The first distance L1 may be 3 μm or more. At this time, the collector-voltage tail can be made to have a configuration of L1=0 μm or less.

Figure 9:
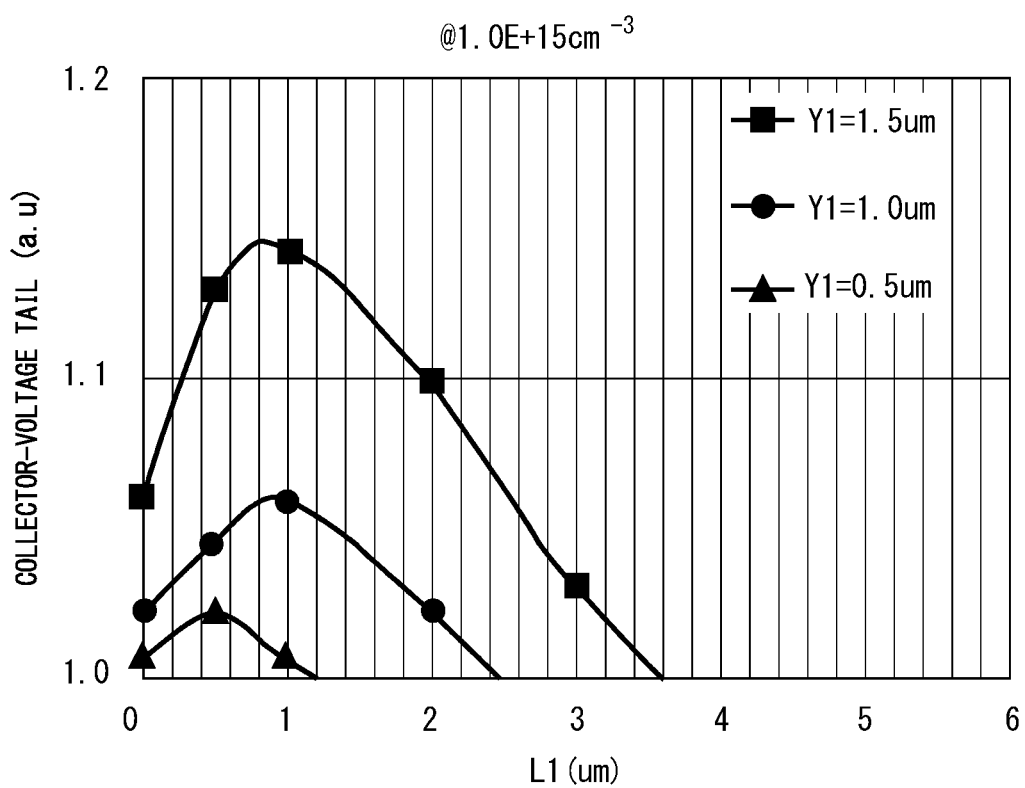
FIG. 9 illustrates a collector-voltage tail when the impurity concentration of the first bottom layer is $10^{15}/cm^3$.
Figure 10:
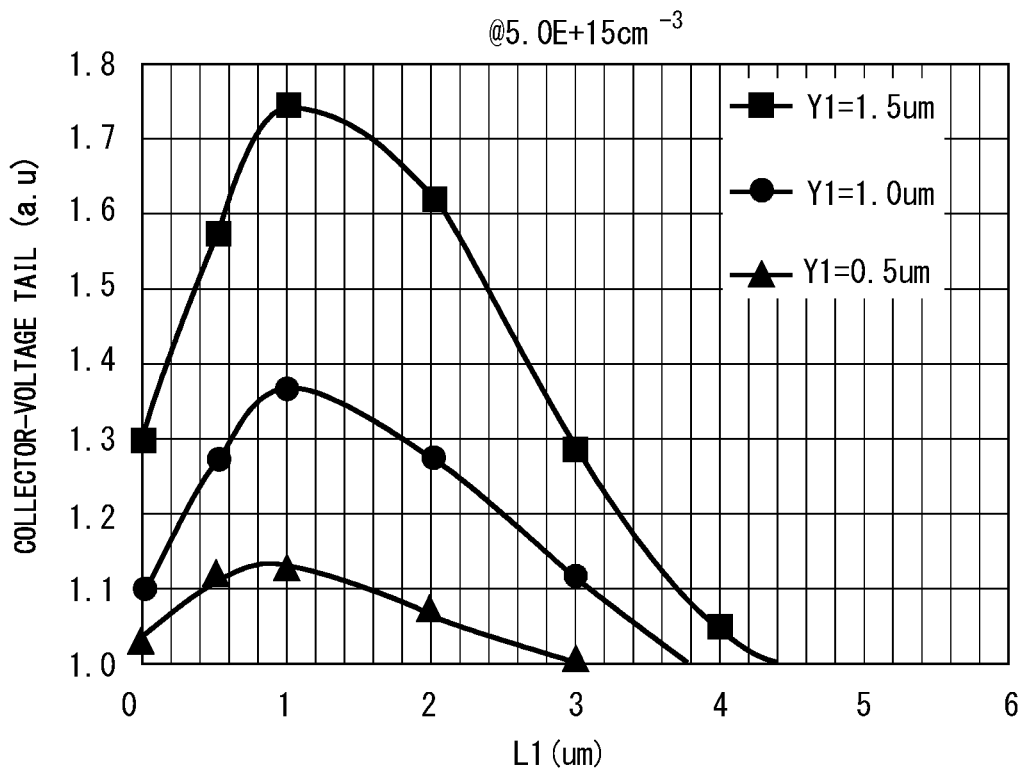
FIG. 10 illustrates a collector-voltage tail when the impurity concentration of the first bottom layer is $5 \times 10^{15}/cm^3$.
Figure 11:
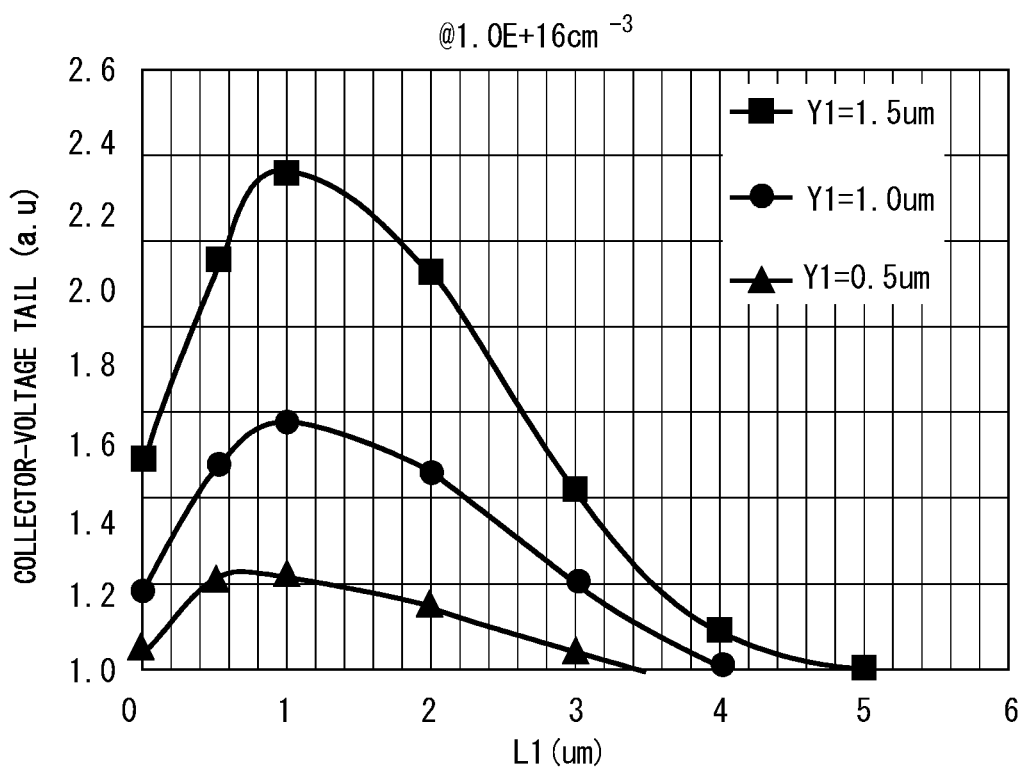
FIG. 11 illustrates a collector-voltage tail when the impurity concentration of the first bottom layer is $10^{16}/cm^3$.
Figure 12:
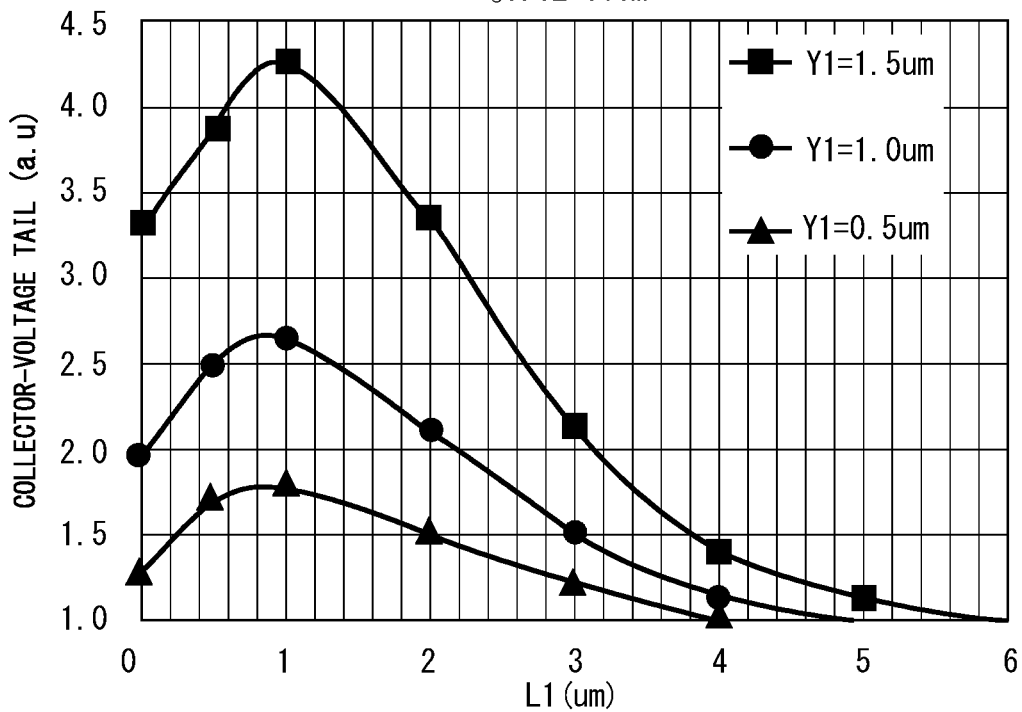
FIG. 12 illustrates a collector-voltage tail when the impurity concentration of the first bottom layer is $5 \times 10^{16}/cm^3$.
Figure 13:
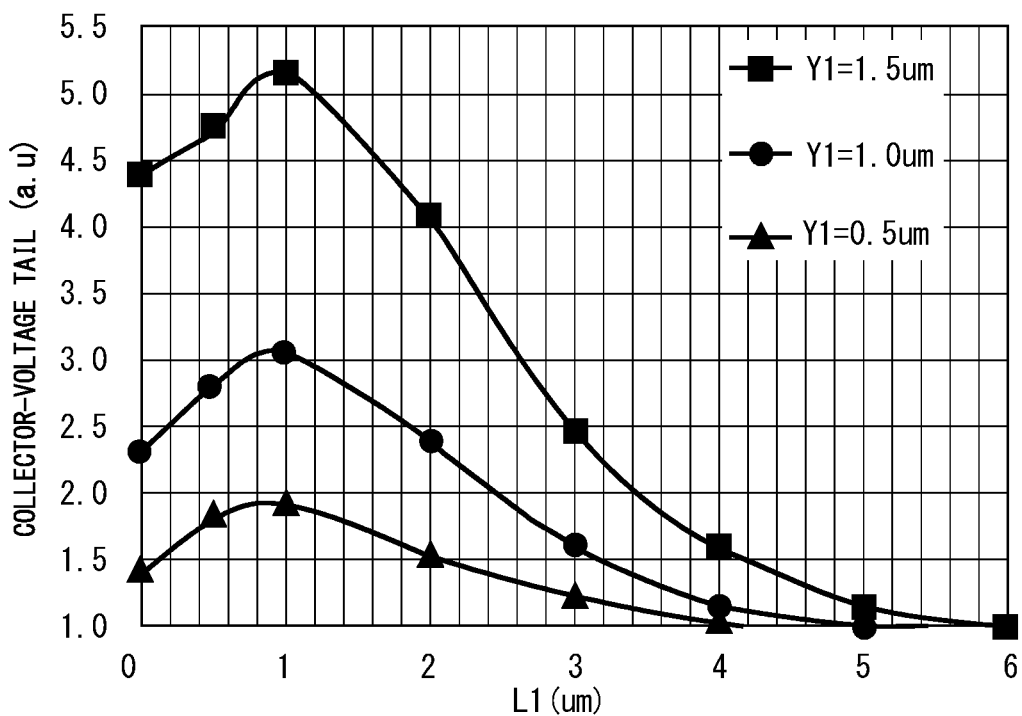
FIG. 13 illustrates a collector-voltage tail when the impurity concentration of the first bottom layer is $10^{17}/cm^3$.

FIG. 9 illustrates a collector-voltage tail when the impurity concentration of the first bottom layer 31 is $10^{15}/cm^3$. FIG. 10 illustrates a collector-voltage tail when the impurity concentration of the first bottom layer 31 is $5\times10^{15}/cm^3$. FIG. 11 illustrates a collector-voltage tail when the impurity concentration of the first bottom layer 31 is $10^{16}/cm^3$. FIG. 12 illustrates a collector-voltage tail when the impurity concentration of the first bottom layer 31 is $5\times10^{16}/cm^3$. FIG. 13 illustrates a collector-voltage tail when the impurity concentration of the first bottom layer 31 is $10^{17}/cm^3$. FIGS. 9 to 13 each illustrate the relationship between the first distance L1 and the collector-voltage tail for each thickness Y1 of the first bottom layer 31. In FIGS. 9 to 13, the collector-voltage tail on the vertical axis is standardized. 1.0 in the vertical axis of each of FIGS. 9 to 13 corresponds to the value of the collector-voltage tail in the structure without the first bottom layer 31.

The larger the thickness Y1, the larger the collector-voltage tail. This is because the distance between the trench 7 and the upper end of the first bottom layer 31 becomes short, and the depletion layer of the first bottom layer 31 easily affects the gate-collector capacitance Cgc. The higher the impurity concentration C1 of the first bottom layer 31, the larger the collector-voltage tail. With the increase in the impurity concentration C1, the depletion layer extending upward from the first bottom layer 31 becomes longer. Therefore, the depletion layer of the first bottom layer 31 tends to affect the gate-collector capacitance Cgc, and the collector-voltage tail increases.

When L1≥3 μm, the collector-voltage tail can be made equivalent to or smaller than that in the case of L1=0 μm in all the specifications of the thickness Y1 and the impurity concentration C1 illustrated in each of FIGS. 9 to 13. Hence the turn-off loss can be reduced.

Figure 14:
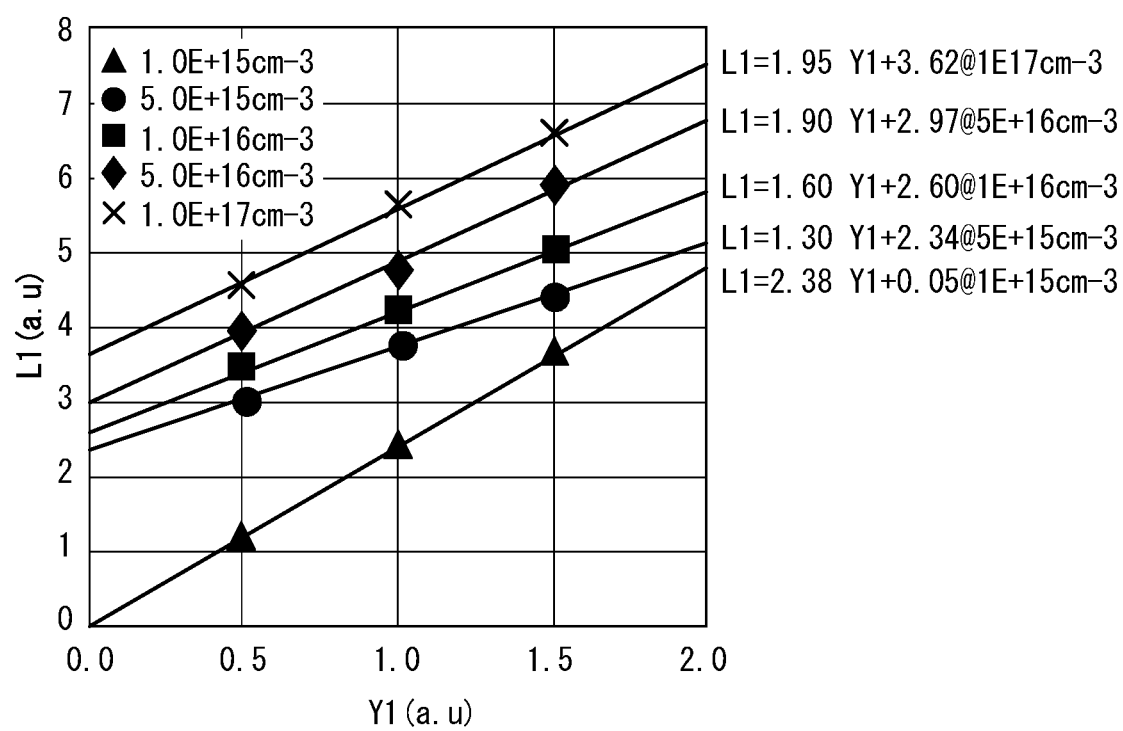
FIG. 14 is a diagram illustrating the relationship between the first distance and the thickness of the first bottom layer when the collector-voltage tail becomes equivalent to that of the structure without the first bottom layer.

FIG. 14 is a diagram illustrating the relationship between the first distance L1 and the thickness Y1 of the first bottom layer 31 when the collector-voltage tail becomes equivalent to that of the structure without the first bottom layer 31. For example, when the impurity concentration is $10^{17}/cm^3$, by satisfying a relationship of L1=1.95×Y1+3.62, the collector-voltage tail becomes equivalent to that of the structure without the first bottom layer 31. Therefore, when the impurity concentration C1 of the first bottom layer 31 is $10^{17}/cm^3$ or less, a relationship of L1≥1.95×Y1−3.62 may be satisfied. Thus, the collector-voltage tail can be made equivalent to or smaller than that of the structure without the first bottom layer 31.

Similarly, when the impurity concentration C1 of the first bottom layer 31 is $5.0×10^{16}/cm^3$ or less, a relationship of L1≥1.90×Y1+2.97 may be satisfied. Further, when the impurity concentration C1 of the first bottom layer 31 is $10^{16}/cm^3$ or less, a relationship of L1≥1.60×Y1+2.60 may be satisfied. When the impurity concentration C1 of the first bottom layer 31 is $5.0×10^{15}/cm^3$ or less, a relationship of L1≥1.30×Y1+2.34 may be satisfied. Further, when the impurity concentration C1 of the first bottom layer 31 is $10^{15}/cm^3$ or less, a relationship of L1≥2.38×Y1+0.05 may be satisfied. By satisfying these relationships, the collector-voltage tail can be made equivalent to or smaller than that of the structure without the first bottom layer 31.

When the impurity concentration C1 of the first bottom layer 31 is $10^{17}/cm^3$ or more, a relationship of L1>1.95×Y1−3.62 may be satisfied. In this case as well, by defining the value of the first distance L1 with respect to the thickness Y1, the effect of reducing the collector-voltage tail can be obtained.

Figure 15:
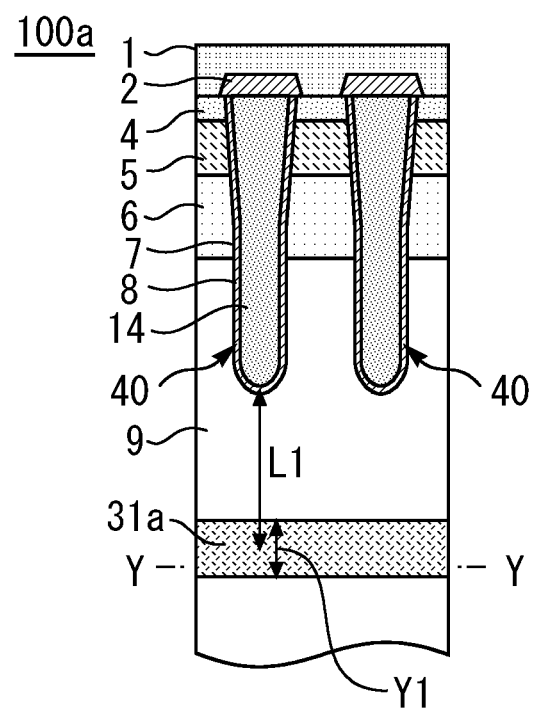
FIG. 15 is a cross-sectional view of a semiconductor device according to a modification of the first embodiment.

FIG. 15 is a cross-sectional view of a semiconductor device 100a according to a modification of the first embodiment. A first bottom layer 31a provided below one of a pair of active trench gates 40 adjacent to each other may be connected to a first bottom layer 31a provided below the other. Thereby, the electric field can be reduced even obliquely below the bottom of the trench 7.

Such a pattern of the first bottom layers 31a may be formed by performing implantation in a dot shape like the first bottom layer 31 shown in FIG. 1 and then connecting the first bottom layers 31a in the lateral direction by thermal diffusion. The first bottom layer 31a may be formed by performing implantation as a solid pattern like the carrier accumulation layer 6.

Figure 16:
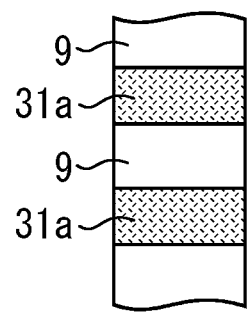
FIG. 16 is a cross-sectional view obtained by cutting FIG. 15 in a section Y-Y.

FIG. 16 is a cross-sectional view obtained by cutting FIG. 15 in a section Y-Y. The first bottom layer 31a may be interrupted in a direction intersecting in plan view with a direction in which the pair of adjacent active trench gates 40 are arranged. That is, the first bottom layer 31a may be thinned out in the depth direction of the trench 7. The on-state voltage can be reduced by partially thinning out the first bottom layer 31a.

The first bottom layer 31a can be formed by using a photoengraving process to perform patterning when implantation is performed into the trench 7. In a case where the multi-epitaxy method is used, the first bottom layer 31a may be formed by using the photoengraving process to perform patterning from the surface of the epitaxial layer.

In FIG. 15, one or both of the pair of active trench gates 40 may be the dummy trench gate 41.

In the present embodiment, an example in which the IGBT is formed on the substrate in the semiconductor device 100 has been described. Alternatively, in the semiconductor device 100, a metal-oxide-semiconductor field-effect transistor (MOSFET) may be formed on the substrate. In this case, the first electrode serves as a source electrode, and the second electrode serves as a drain electrode. The collector layer 11 on the rear surface side of the substrate is not provided.

In the present embodiment and the following embodiments, an example in which the bottom layer is provided below the active trench gate 40 has been and will be described, but the bottom layer may be provided below the dummy trench gate 41.

In the semiconductor device 100, the substrate may be made with a wide bandgap semiconductor. The wide bandgap semiconductor is, for example, silicon carbide, gallium nitride-based material, or diamond. When a wide bandgap semiconductor is used as the semiconductor material, electric field concentration at the bottom of the trench and dielectric breakdown of the gate oxide film easily become problematic. In the present embodiment, by applying the first bottom layer 31 to the semiconductor device 100 made with the wide bandgap semiconductor, the electric field concentration and the dielectric breakdown of the gate oxide film can be prevented while the collector-voltage tail is reduced.

These modifications can be appropriately applied to semiconductor device according to embodiments below. Meanwhile, for the semiconductor devices according to the embodiments below, dissimilarities with the first embodiment will mainly be explained as they have many similarities with the first embodiment.

Second Embodiment

Figure 17:
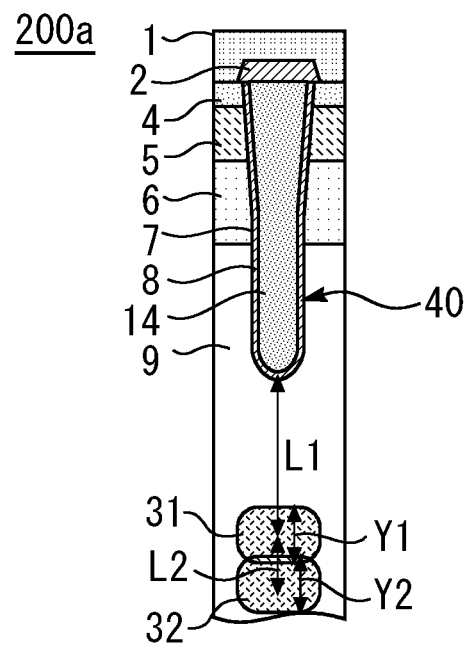
FIG. 17 is a cross-sectional view of a semiconductor device according to a second embodiment.

FIG. 17 is a cross-sectional view of a semiconductor device 200a according to a second embodiment. The semiconductor device 200a includes a p type second bottom layer 32 provided below the first bottom layer 31 in the drift layer 9. Further, two or more bottom layers may be provided below the first bottom layer 31. By increasing the number of bottom layers arranged in the thickness direction of the substrate, it is possible to improve the effect of relaxing the electric field. In the example illustrated in FIG. 17, the first bottom layer 31 and the second bottom layer 32 are in contact with each other.

In the IGBT, when the electric field at the bottom of the trench 7 increases at the time of turn-off, a dynamic avalanche may occur. At this time, hot carriers generated due to impact ionization are discharged, which may cause an increase in turn-off loss. Further, the gate oxide film 8 at the bottom of the trench 7 is exposed to the hot carriers, which may lead to a deterioration in gate characteristics. In the present embodiment, by providing two or more bottom layers, the electric field can be relaxed more to reduce the dynamic avalanche.

Figure 18:
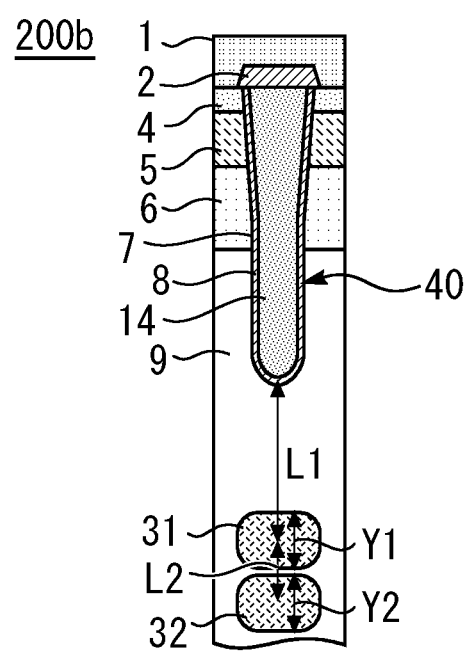
FIG. 18 is a cross-sectional view of a semiconductor device according to a first modification of the second embodiment.

FIG. 18 is a cross-sectional view of a semiconductor device 200b according to a first modification of the second embodiment. The first bottom layer 31 and the second bottom layer 32 may be separated from each other. That is, the bottom layers may be arranged so as not to contact each other in the thickness direction of the substrate. With this configuration, the depletion layer can be extended to a portion of the drift layer 9 between the bottom layer and the bottom layer. Hence the depletion layer becomes longer, and the electric field can further be relaxed.

Moreover, the interval between the first bottom layer 31 and the second bottom layer 32 may be larger than the thickness Y1 of the first bottom layer 31. The interval between the bottom layers becomes wider, so that the depletion layer becomes longer, and the electric field can be relaxed more. Not limited to the first bottom layer 31 and the second bottom layer 32, the interval between the lower end of the upper bottom layer and the upper end of the lower bottom layer may be larger than the thickness of the upper bottom layer.

As described above, in order to reduce the collector-voltage tail, it is effective to increase the first distance L1. For reducing the dynamic avalanche, it is effective to increase a second distance L2. The second distance L2 is a distance between a portion of the second bottom layer 32 where the impurity concentration peaks in the thickness direction and a portion of the first bottom layer 31 where the impurity concentration peaks in the thickness direction. However, in the manufacturing method illustrated in FIG. 5, there is a limit to the implantation depth. Hence it is preferable to arrange the bottom layers so that the turn-off loss takes a minimum value within the limited depth.

It is thus preferable to determine the arrangement of the bottom layers in consideration of which rate is larger, an increase in turn-off loss due to the collector-voltage tail or an increase in turn-off loss due to the dynamic avalanche. This rate is determined, for example, based on the gate resistance at the time of turn-off.

Figure 19:
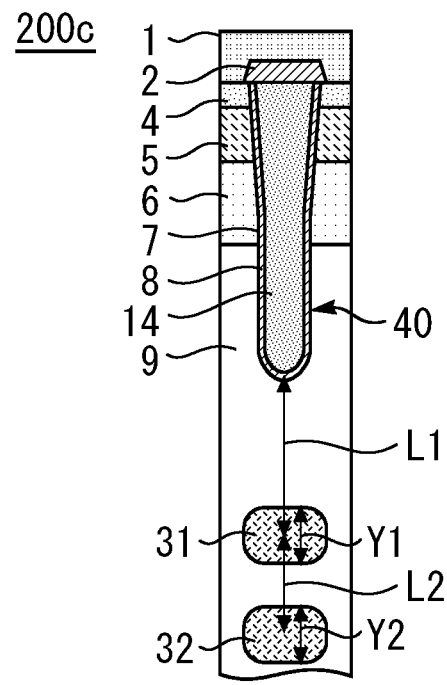
FIG. 19 is a cross-sectional view of a semiconductor device according to a second modification of the second embodiment.

FIG. 19 is a cross-sectional view of a semiconductor device 200c according to a second modification of the second embodiment. For example, when the gate resistance at the time of turn-off is large, a period during which the collector-voltage tail occurs tends to be long. Thus, the rate of increase in turn-off loss due to the collector-voltage tail tends to be large. In such a case, it is preferable to give priority to the reduction in collector-voltage tail and arrange the bottom layers so that the first distance L1 is larger than the second distance L2, as illustrated in FIG. 19.

In a case where three or more bottom layers are provided, L1>L2, L3 . . . Ln may be set. Here, Ln is the distance between the concentration peaks of an nth bottom layer and an (n−1)th bottom layer. Such arrangement can reduce the collector-voltage tail and can reduce the turn-off loss within the limited implantation depth.

When the gate resistance is small, the rate of increase in turn-off loss due to the collector-voltage tail tends to be small. Further, the electric field intensity at the bottom of the trench 7 increases, and the dynamic avalanche tends to occur. This is because, due to a quick turn-off of the gate, the electron injection amount is reduced, and the space charge density at the bottom of the trench 7 increases. Thus, when the gate resistance is small, the rate of increase in turn-off loss caused by the dynamic avalanche tends to increase.

Figure 20:
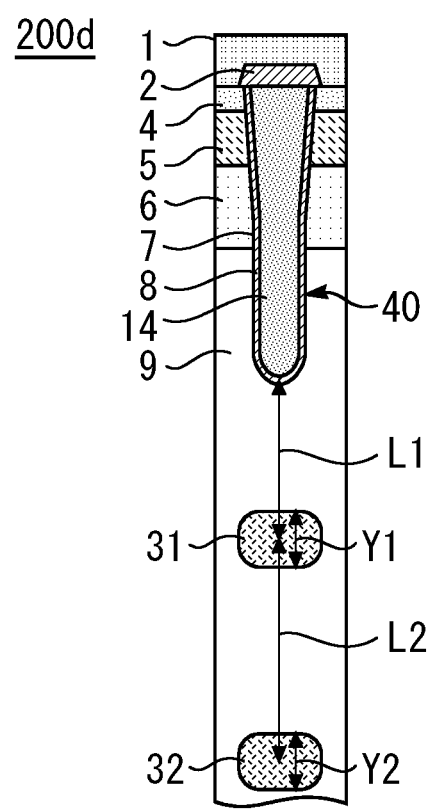
FIG. 20 is a cross-sectional view of a semiconductor device according to a third modification of the second embodiment.

FIG. 20 is a cross-sectional view of a semiconductor device 200d according to a third modification of the second embodiment. When the gate resistance is small, it is preferable to give priority to the reduction in dynamic avalanche and make the second distance L2 larger than the first distance L1, as illustrated in FIG. 20. In a case where three or more bottom layers are provided, L1<L2, L3 . . . Ln may be set. Such arrangement can reduce the dynamic avalanche and can reduce the turn-off loss within the limited implantation depth.

Figure 21:
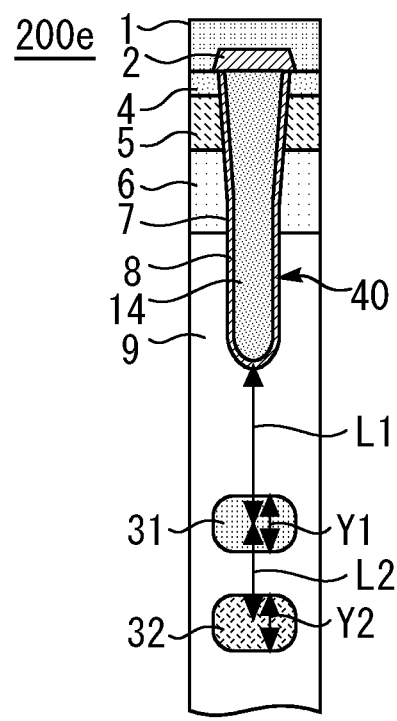
FIG. 21 is a cross-sectional view of a semiconductor device according to a fourth modification of the second embodiment.

FIG. 21 is a cross-sectional view of a semiconductor device 200e according to a fourth modification of the second embodiment. Hereinafter, the impurity concentration of the first bottom layer 31 is referred to as C1, the impurity concentration of the second bottom layer 32 is referred to as C2, the impurity concentration of the third bottom layer 33 is referred to as C3, and the impurity concentration of the nth bottom layer is referred to as Cn. The impurity concentration C1 of the first bottom layer 31 may be lower than the impurity concentration C2 of the second bottom layer 32. When three or more bottom layers are provided, C1 may be made the lowest so as to satisfy a relationship of C1<C2, C3 . . . .

As illustrated in FIGS. 9 to 13, the lower the concentration of the bottom layer, the smaller the collector-voltage tail. Of the bottom layers, the first bottom layer 31 near the bottom of the trench 7 has the largest influence on the collector-voltage tail. Therefore, the collector-voltage tail can be reduced by minimizing the impurity concentration of the first bottom layer 31.

Figure 22:
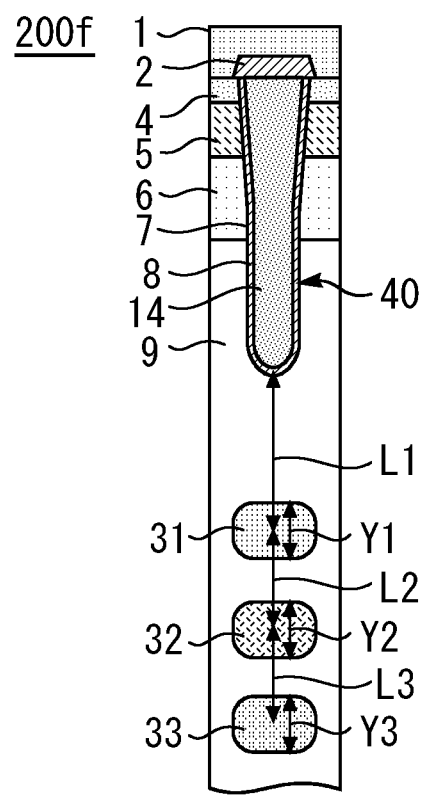
FIG. 22 is a cross-sectional view of a semiconductor device according to a fifth modification of the second embodiment.

FIG. 22 is a cross-sectional view of a semiconductor device 200f according to a fifth modification of the second embodiment. The semiconductor device 200f includes a p type third bottom layer 33 provided below the second bottom layer 32 in the drift layer 9. The impurity concentration C1 of the first bottom layer 31 may be lower than the impurity concentration C2 of the second bottom layer 32, and the impurity concentration C2 of the second bottom layer 32 may be lower than an impurity concentration C3 of the third bottom layer 33. That is, the impurity concentration may be made higher in the lower bottom layer so as to satisfy a relationship of C1<C2< . . . <Cn.

When the concentration of the bottom layer is made high, an electric field applied to the bottom layer becomes large. That is, the dynamic avalanche tends to occur. Making the impurity concentration higher in the lower bottom layer enables the occurrence of the dynamic avalanche at a position away from the bottom of the trench 7. Hence it is possible to reduce the injection of hot carriers into the gate oxide film 8 at the bottom of the trench 7. Therefore, the deterioration in gate characteristics due to the dynamic avalanche can be prevented.

Figure 23:
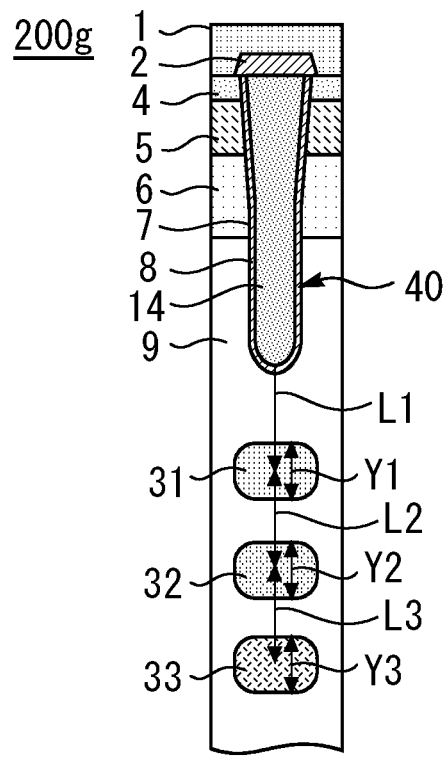
FIG. 23 is a cross-sectional view of a semiconductor device according to a sixth modification of the second embodiment.

FIG. 23 is a cross-sectional view of a semiconductor device 200g according to a sixth modification of the second embodiment. The impurity concentration C1 of the first bottom layer 31 may be lower than the impurity concentration C3 of the third bottom layer 33, and the impurity concentration C3 of the third bottom layer 33 may be lower than the impurity concentration C2 of the second bottom layer 32. That is, a relationship of C1<C3<C2 may be satisfied.

In a case where there are two or more bottom layers, the electric field applied to the bottom layer tends to be higher in the lower position. Further, because the lower bottom layer decreases the electric field, the electric field applied to the upper bottom layer becomes lower. Thus, the electric fields are not uniform. By satisfying the relationship of C1<C3<C2, the electric field of the third bottom layer 33 can be lowered, and the electric field of the second bottom layer 32 can be raised more than when the impurity concentrations of the second bottom layer 32 and the third bottom layer 33 are the same. Therefore, the nonuniformity of the electric fields can be improved. In the first bottom layer 31 having a low impurity concentration, the occurrence of a dynamic avalanche can be reduced. Therefore, the deterioration in gate characteristics due to the dynamic avalanche can be prevented.

In FIG. 23, the three adjacent bottom layers have been described. Alternatively, another bottom layer may be provided between the first bottom layer 31 and the second bottom layer 32 or between the second bottom layer 32 and the third bottom layer 33. That is, it is sufficient that the first bottom layer 31 have the lowest concentration, the lowermost bottom layer have the middle concentration, and the bottom layer between the first bottom layer 31 and the lowermost bottom layer have the highest concentration.

Figure 24:
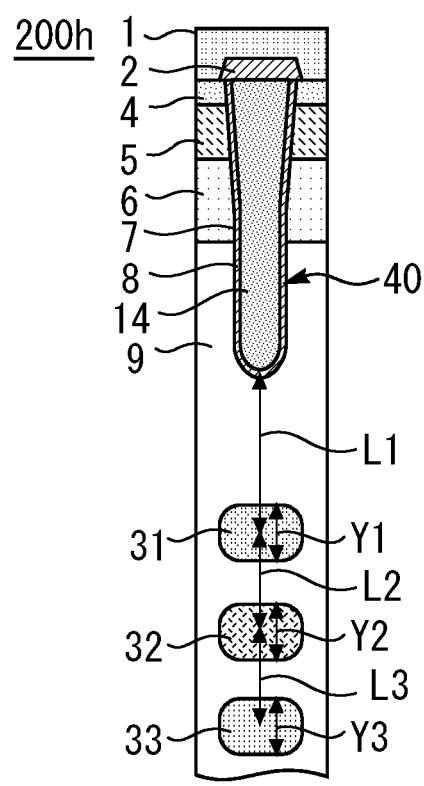
FIG. 24 is a cross-sectional view of a semiconductor device according to a seventh modification of the second embodiment.

FIG. 24 is a cross-sectional view of a semiconductor device 200h according to a seventh modification of the second embodiment. The impurity concentration C1 of the first bottom layer 31 may be higher than the impurity concentration C2 of the second bottom layer 32, and the impurity concentration C2 of the second bottom layer 32 may be higher than the impurity concentration C3 of the third bottom layer 33. That is, as C1>C2>C3 . . . >Cn, the impurity concentration of the bottom layer may be lower in the lower position.

As described above, the electric field applied to the bottom layer tends to be higher in the lower position. By lowering the impurity concentration of the bottom layer, the electric field applied to the bottom layer can be reduced. Therefore, by making the impurity concentration of the bottom layer lower in the lower position, the nonuniformity of the electric fields applied to the plurality of bottom layers can be improved, and the dynamic avalanche can be reduced.

Figure 25:
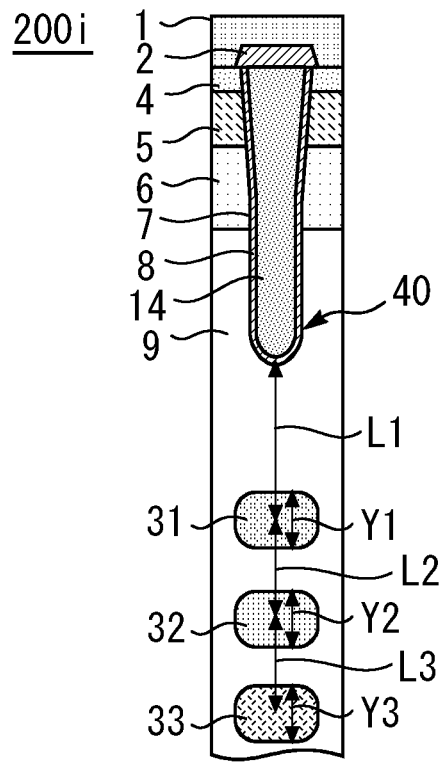
FIG. 25 is a cross-sectional view of a semiconductor device according to an eighth modification of the second embodiment.

FIG. 25 is a cross-sectional view of a semiconductor device 200i according to an eighth modification of the second embodiment. The impurity concentration C1 of the first bottom layer 31 may be higher than the impurity concentration C3 of the third bottom layer 33, and the impurity concentration C3 of the third bottom layer 33 may be higher than the impurity concentration C2 of the second bottom layer 32. That is, a relationship of C1>C3>C2 may be satisfied. In the semiconductor device 200i, the impurity concentration of the lowermost bottom layer is higher than that in the semiconductor device 200h. This increases the electric field in the lowermost bottom layer and enables the reliable occurrence of the dynamic avalanche in the lowermost layer. It is thereby possible to improve the nonuniformity of the electric fields while preventing the deterioration in gate characteristics due to the dynamic avalanche.

In FIG. 25, the three adjacent bottom layers have been described. Alternatively, another bottom layer may be provided between the first bottom layer 31 and the second bottom layer 32 or between the second bottom layer 32 and the third bottom layer 33. That is, it is sufficient that the first bottom layer 31 have the highest concentration, the lowermost bottom layer have the middle concentration, and the bottom layer between the first bottom layer 31 and the lowermost bottom layer have the lowest concentration.

Figure 26:
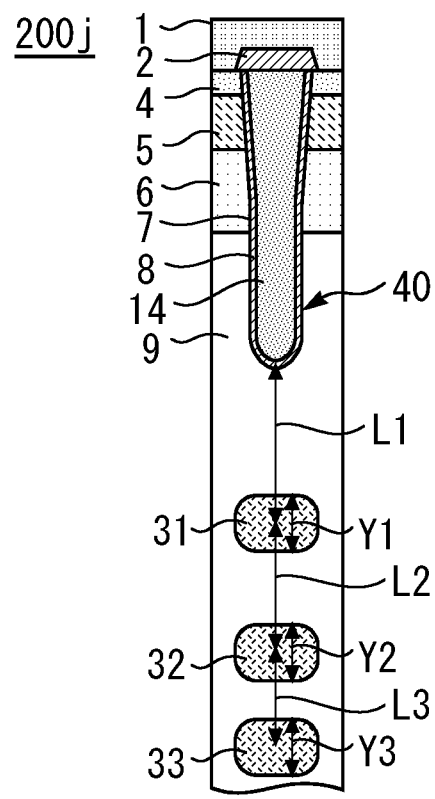
FIG. 26 is a cross-sectional view of a semiconductor device according to a ninth modification of the second embodiment

FIG. 26 is a cross-sectional view of a semiconductor device 200j according to a ninth modification of the second embodiment. The second distance L2 may be larger than a third distance L3 between the portion of the second bottom layer 32 where the impurity concentration peaks in the thickness direction and a portion of the third bottom layer 33 where the impurity concentration peaks in the thickness direction. That is, the interval between the bottom layers may be narrower in the lower position so as to satisfy a relationship of L2>L3 . . . >Ln.

The shorter the interval between the vertically adjacent bottom layers, the higher the electric fields applied to the lower and upper bottom layers. That is, the dynamic avalanche tends to occur. With the interval between the bottom layers being narrower in the lower position, the dynamic avalanche can be caused to occur at a position away from the bottom of the trench 7. It is thus possible to reduce the injection of hot carriers into the gate oxide film 8 at the bottom of the trench 7 and to prevent the deterioration in gate characteristics due to the dynamic avalanche.

Figure 27:
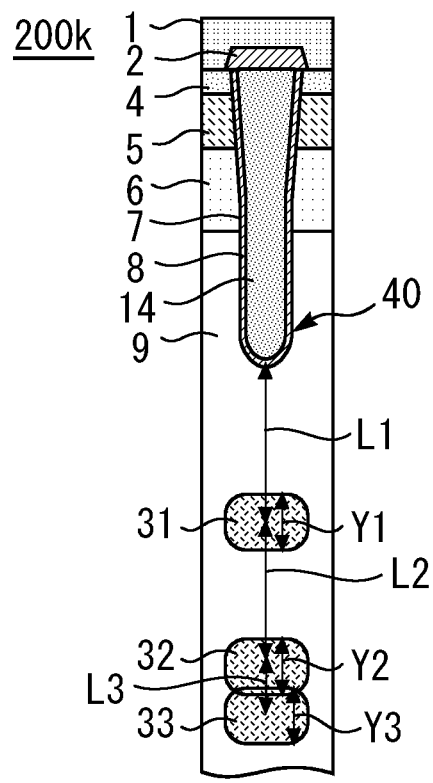
FIG. 27 is a cross-sectional view of a semiconductor device according to a tenth modification of the second embodiment.

FIG. 27 is a cross-sectional view of a semiconductor device 200k according to a tenth modification of the second embodiment. More preferably, the second bottom layer 32 and the third bottom layer 33 may be in contact with each other. As a result, the interval between the bottom layers becomes narrower, and the electric field increases. Therefore, the dynamic avalanche tends to occur at a position away from the bottom of the trench 7.

Figure 28:
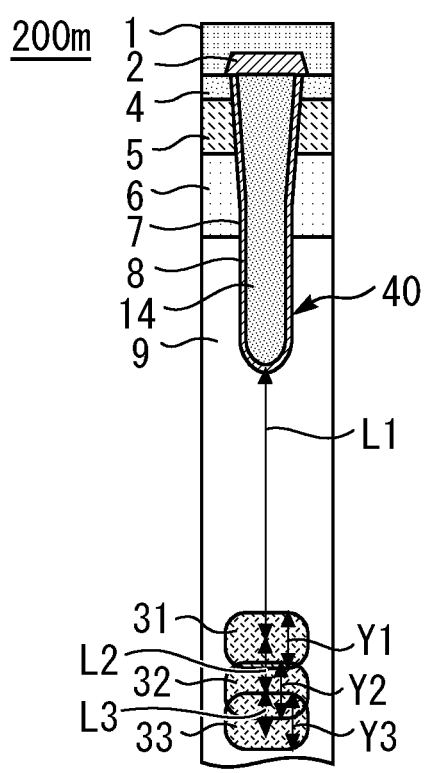
FIG. 28 is a cross-sectional view of a semiconductor device according to an eleventh modification of the second embodiment.

FIG. 28 is a cross-sectional view of a semiconductor device 200m according to an eleventh modification of the second embodiment. All the bottom layers may be in contact with each other so long as the relationship of L2>L3 . . . >Ln is satisfied.

Figure 29:
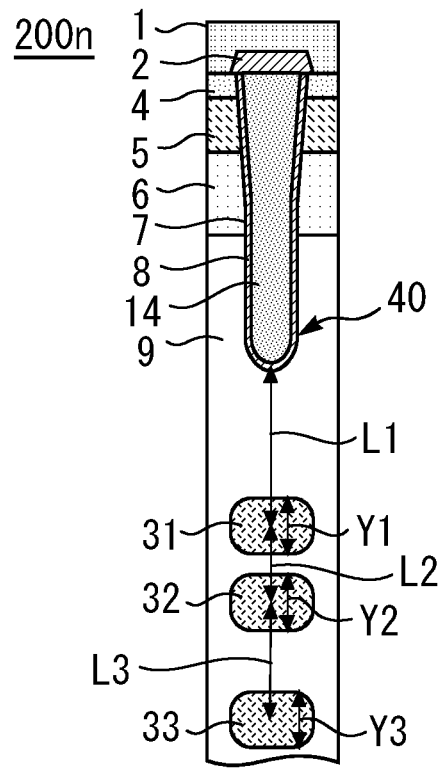
FIG. 29 is a cross-sectional view of a semiconductor device according to a twelfth modification of the second embodiment.

FIG. 29 is a cross-sectional view of a semiconductor device 200n according to a twelfth modification of the second embodiment. The second distance L2 may be smaller than the third distance L3. That is, the interval between the bottom layers may be narrower in the upper position so as to satisfy the relationship of L2<L3 . . . <Ln. Thus, the electric field can be made higher in the upper bottom layer where the electric field tends to be lower. It is thus possible to improve the nonuniformity of the electric fields in the plurality of bottom layers and to reduce the dynamic avalanche.

Figure 30:
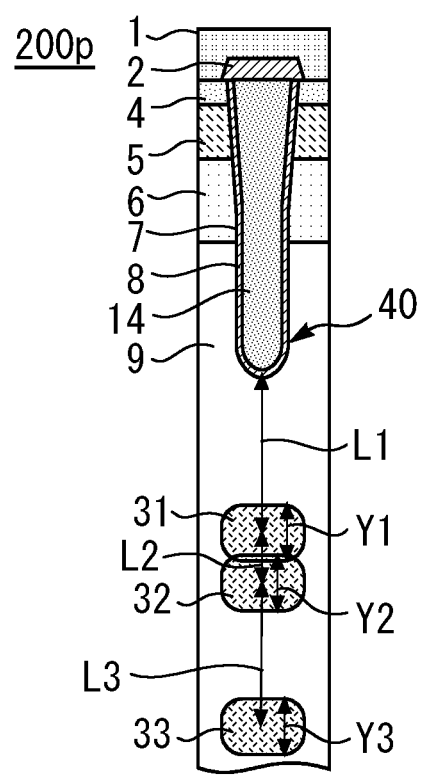
FIG. 30 is a cross-sectional view of a semiconductor device according to a thirteenth modification of the second embodiment.
Figure 31:
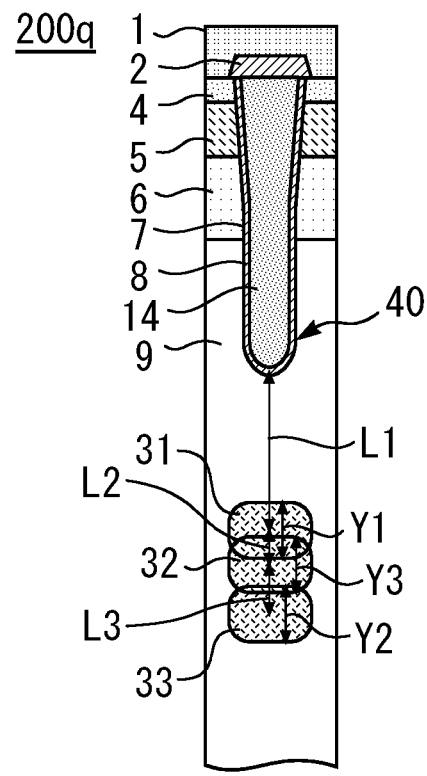
FIG. 31 is a cross-sectional view of a semiconductor device according to a fourteenth modification of the second embodiment.

FIG. 30 is a cross-sectional view of a semiconductor device 200p according to a thirteenth modification of the second embodiment. The first bottom layer 31 and the second bottom layer 32 may be in contact with each other. FIG. 31 is a cross-sectional view of a semiconductor device 200q according to a fourteenth modification of the second embodiment. The first bottom layer 31, the second bottom layer 32, and the third bottom layer 33 may be in contact with each other so long as the relationship of L2>L3 . . . >Ln is satisfied. As illustrated in FIGS. 30 and 31, the second distance L2 and the third distance L3 may be reduced until the bottom layers contact each other to enhance the effect of improving the nonuniformity of the electric fields.

Figure 32:
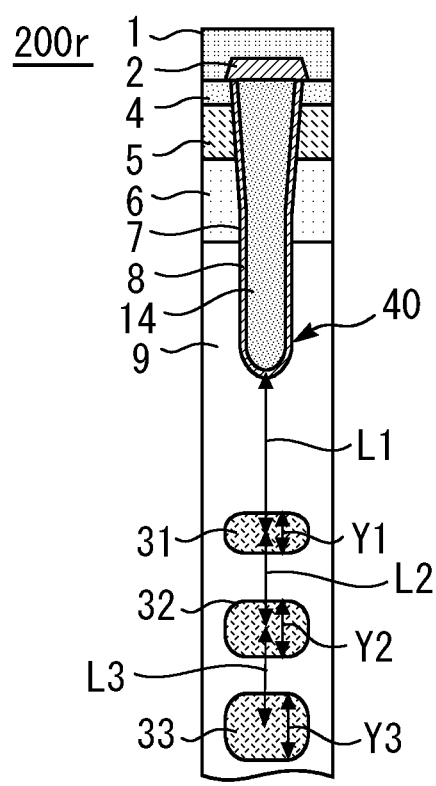
FIG. 32 is a cross-sectional view of a semiconductor device according to a fifteenth modification of the second embodiment.

FIG. 32 is a cross-sectional view of a semiconductor device 200r according to a fifteenth modification of the second embodiment. The thickness Y1 of the first bottom layer 31 may be smaller than a thickness Y2 of the second bottom layer 32. The thickness of the first bottom layer 31 may be made the smallest among the plurality of bottom layers so as to satisfy a relationship of Y1<Y2, Y3 . . . Yn. Here, Yn is the thickness of the nth bottom layer.

As illustrated in FIGS. 9 to 13, the thinner the bottom layer, the smaller the collector-voltage tail. Of the bottom layers, the first bottom layer 31 near the bottom of the trench 7 has the largest influence on the collector-voltage tail. Therefore, the collector-voltage tail can be reduced by minimizing the thickness of the first bottom layer 31 among the plurality of bottom layers.

The deeper the position at which the bottom layer is formed by high-energy implantation, the wider the half-width of the bottom layer becomes. Therefore, by forming a plurality of bottom layers by high-energy implantation, a plurality of bottom layers having different thicknesses can be formed. The first bottom layer 31 having a smaller thickness may be formed using aluminum with a smaller diffusion coefficient, and the second bottom layer 32 having a larger thickness may be formed using boron with a larger diffusion coefficient. Thus, the difference in thickness can be formed.

The thickness Y1 of the first bottom layer 31 may be smaller than the thickness Y2 of the second bottom layer 32, and the thickness Y2 of the second bottom layer 32 may be smaller than a thickness Y3 of the third bottom layer 33. That is, the thickness of the bottom layer may be smaller in the upper position so as to satisfy a relationship of $Y1<Y2<Y3 \ldots <Yn$. The bottom layer having the second largest influence on the collector-voltage tail, following the first bottom layer 31 near the bottom of the trench 7, is the second bottom layer 32. Therefore, the collector-voltage tail can be further reduced by making the thickness of the bottom layer smaller in the upper position.

Figure 33:
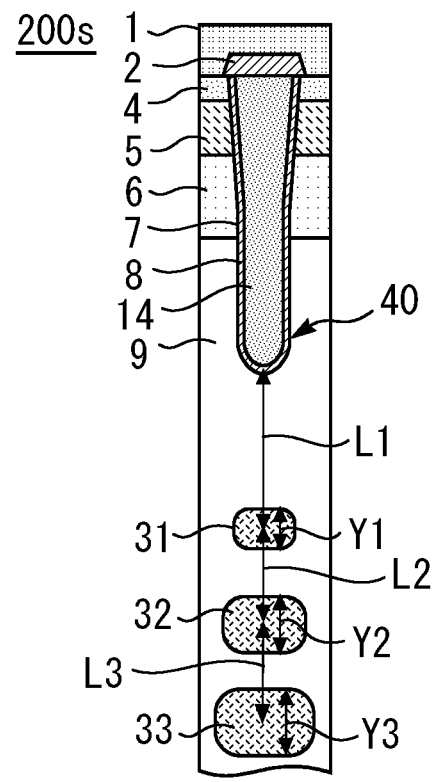
FIG. 33 is a cross-sectional view of a semiconductor device according to a sixteenth modification of the second embodiment.

FIG. 33 is a cross-sectional view of a semiconductor device 200s according to a sixteenth modification of the second embodiment. The width of the first bottom layer 31 may be smaller than the width of the second bottom layer 32. The above configuration is not limited to the thickness, but the width of the bottom layer may be smaller in the upper position. The smaller the volume of the bottom layer, the smaller the collector-voltage tail can be made. Therefore, the collector-voltage tail can be reduced with this configuration as well.

Figure 34:
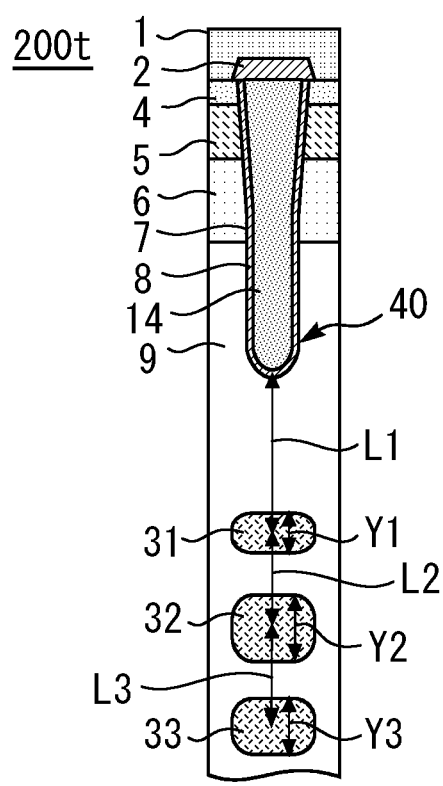
FIG. 34 is a cross-sectional view of a semiconductor device according to a seventeenth modification of the second embodiment.

FIG. 34 is a cross-sectional view of a semiconductor device 200t according to a seventeenth modification of the second embodiment. The thickness Y1 of the first bottom layer 31 may be smaller than the thickness Y3 of the third bottom layer 33, and the thickness Y3 of the third bottom layer 33 may be smaller than the thickness Y2 of the second bottom layer 32. That is, a relationship of $Y1<Y3<Y2$ may be satisfied. As described above, when there are two or more bottom layers, the electric field of the lower bottom layer tends to be higher. By setting the thickness so as to satisfy the relationship of $Y1<Y3<Y2$, it is possible to make the electric field of the third bottom layer 33 low and to make the electric field of the second bottom layer 32 high as compared to the configuration illustrated in FIG. 32. Therefore, the nonuniformity of the electric fields can be improved.

In FIG. 34, the three adjacent bottom layers have been described. Alternatively, another bottom layer may be provided between the first bottom layer 31 and the second bottom layer 32 or between the second bottom layer 32 and the third bottom layer 33. That is, it is sufficient that the first bottom layer 31 be the thinnest, the lowermost bottom layer be the second thinnest, and the bottom layer between the first bottom layer 31 and the lowermost bottom layer be the thickest.

Figure 35:
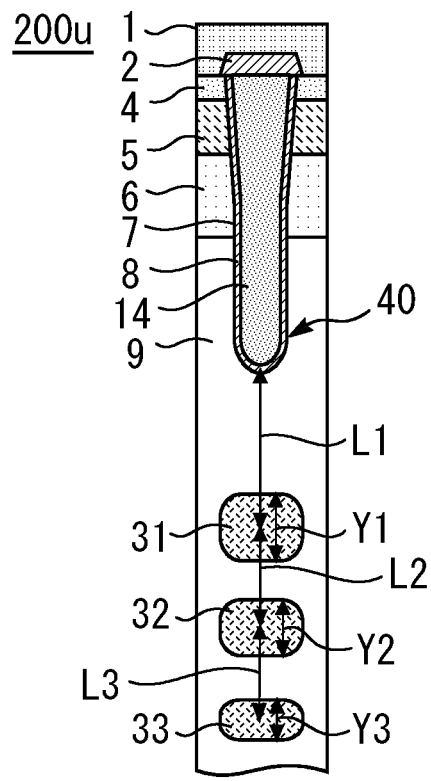
FIG. 35 is a cross-sectional view of a semiconductor device according to an eighteenth modification of the second embodiment.

FIG. 35 is a cross-sectional view of a semiconductor device 200u according to an eighteenth modification of the second embodiment. The thickness Y1 of the first bottom layer 31 may be larger than the thickness Y2 of the second bottom layer 32, and the thickness Y2 of the second bottom layer 32 may be larger than the thickness Y3 of the third bottom layer 33. That is, the thickness of the bottom layer may be smaller in the lower position so as to satisfy a relationship of $Y1>Y2>Y3 \ldots >Yn$.

As described above, when there are two or more bottom layers, the electric field of the lower bottom layer tends to be higher. The thinner the bottom layer, the shorter the depletion layer becomes in the thickness direction of the substrate. Hence the electric field applied to the bottom layer can be reduced. Thus, the nonuniformity of the electric fields in the bottom layers can be improved by making the thickness of the bottom layer smaller in the lower position. Therefore, the dynamic avalanche can be reduced.

Figure 36:
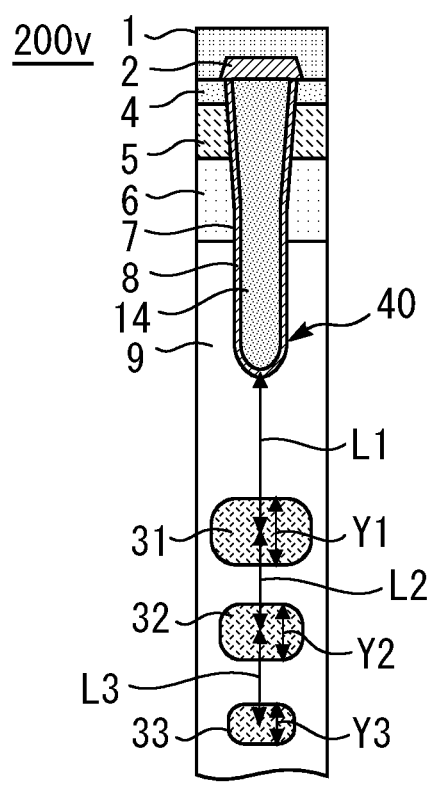
FIG. 36 is a cross-sectional view of a semiconductor device according to a nineteenth modification of the second embodiment.

FIG. 36 is a cross-sectional view of a semiconductor device 200v according to a nineteenth modification of the second embodiment. The width of the first bottom layer 31 may be larger than the width of the second bottom layer 32. That is, the width of the bottom layer may be smaller in the lower position. The smaller the width of the bottom layer, the smaller the width of the depletion layer. Thus, the electric field applied to the bottom layer can be reduced. Therefore, it is possible to improve the nonuniformity of the electric fields in the bottom layers and to reduce the dynamic avalanche.

Figure 37:
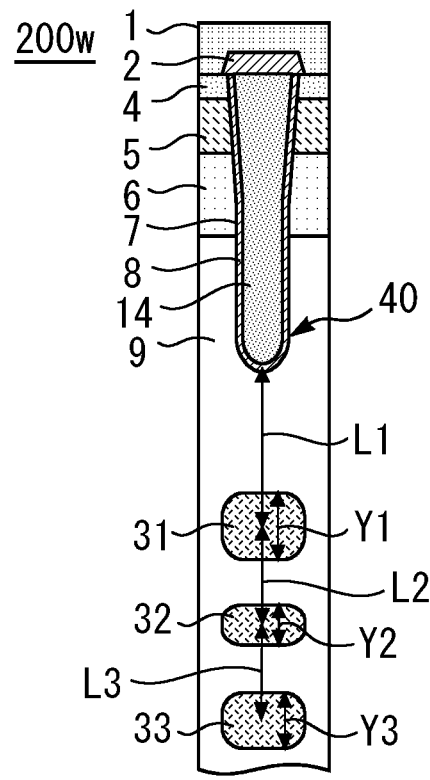
FIG. 37 is a cross-sectional view of a semiconductor device according to a twentieth modification of the second embodiment.

FIG. 37 is a cross-sectional view of a semiconductor device 200w according to a twentieth modification of the second embodiment. The thickness Y1 of the first bottom layer 31 may be larger than the thickness Y3 of the third bottom layer 33, and the thickness Y3 of the third bottom layer 33 may be larger than the thickness Y2 of the second bottom layer 32. That is, a relationship of $Y1>Y3>Y2$ may be satisfied. With this configuration, the electric field in the lowermost bottom layer is high as compared to the configuration illustrated in FIG. 35. This can cause the dynamic avalanche to occur in the lowermost layer. It is thereby possible to improve the nonuniformity of the electric fields while preventing the deterioration in gate characteristics due to the dynamic avalanche.

In FIG. 37, the three adjacent bottom layers have been described. Alternatively, another bottom layer may be provided between the first bottom layer 31 and the second bottom layer 32 or between the second bottom layer 32 and the third bottom layer 33. That is, the first bottom layer 31 may be the thickest, the lowermost bottom layer may be the second thickest, and the bottom layer between the first bottom layer 31 and the lowermost bottom layer may be the thinnest.

Third Embodiment

Figure 38:
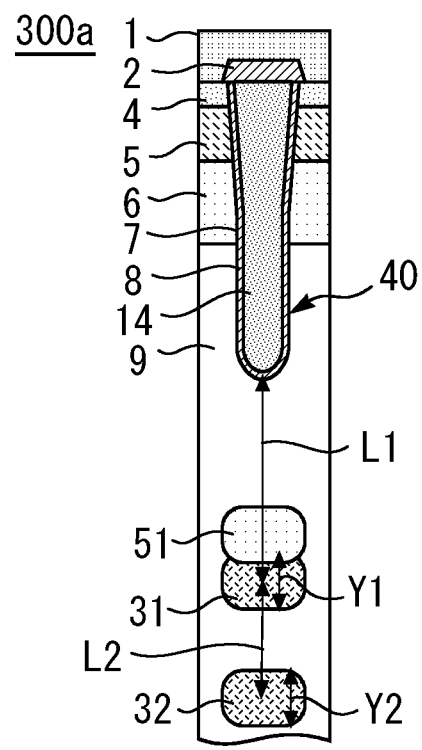
FIG. 38 is a cross-sectional view of a semiconductor device according to a third embodiment.

FIG. 38 is a cross-sectional view of a semiconductor device 300a according to a third embodiment. The semiconductor device 300a includes an intermediate layer 51 provided between the first bottom layer 31 and the active trench gate 40. The intermediate layer 51 is n type and has a higher concentration than that of the drift layer 9. The intermediate layer 51 prevents the depletion layer of the first bottom layer 31 from extending to the trench 7 side. This makes it possible to reduce the drop in the gate-collector capacitance Cgc described in the first embodiment. Therefore, the collector-voltage tail can be reduced. In the configuration of FIG. 38, for example, the intermediate layer 51 is in contact with the first bottom layer 31.

The higher the impurity concentration of the intermediate layer 51, the higher the effect of reducing the drop in the gate-collector capacitance Cgc. The impurity concentration of the intermediate layer 51 may be higher than that of the first bottom layer 31. Thus, the collector-voltage tail can be further reduced. In order to reduce the electric field, the impurity concentration of the first bottom layer 31 may be made higher than that of the intermediate layer 51.

Figure 39:
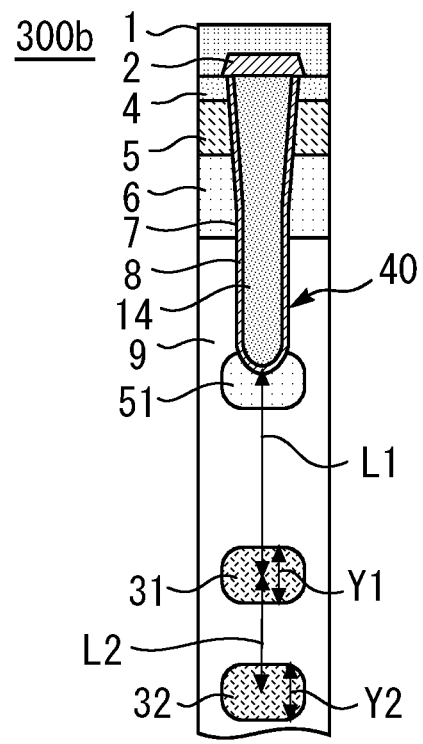
FIG. 39 is a cross-sectional view of a semiconductor device according to a first modification of the third embodiment.

FIG. 39 is a cross-sectional view of a semiconductor device 300b according to a first modification of the third embodiment. The intermediate layer 51 may be separated from the first bottom layer 31. With this configuration, the depletion layer of the first bottom layer 31 can be extended to a portion of the drift layer 9 between the intermediate layer 51 and the first bottom layer 31. It is thus possible to reduce the electric field and to reduce the dynamic avalanche.

Figure 40:
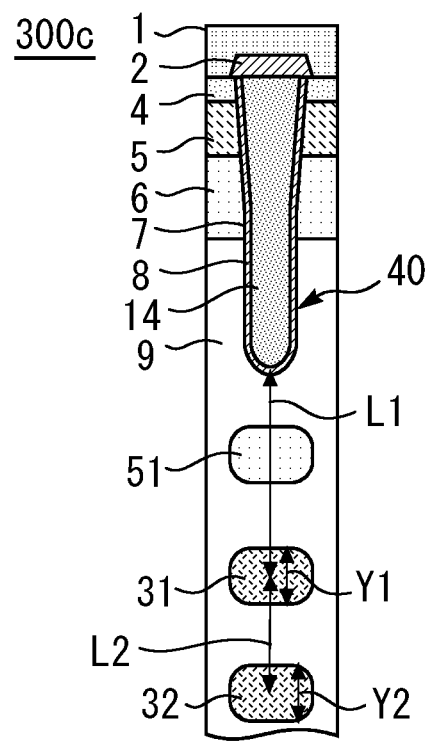
FIG. 40 is a cross-sectional view of a semiconductor device according to a second modification of the third embodiment.

FIG. 40 is a cross-sectional view of a semiconductor device 300c according to a second modification of the third embodiment. The intermediate layer 51 may be in contact with the bottom of the trench 7, but preferably, as illustrated in FIG. 40, the intermediate layer 51 may be separated from the active trench gate 40. At the bottom of the trench 7, the electric field is particularly easily concentrated due to the influence of the shape. Thus, when there is an n type layer at the bottom of the trench, the electric field may increase. Therefore, by separating the intermediate layer 51 from the bottom of the trench 7, the electric field at the bottom of the trench 7 can be further reduced.

Figure 41:
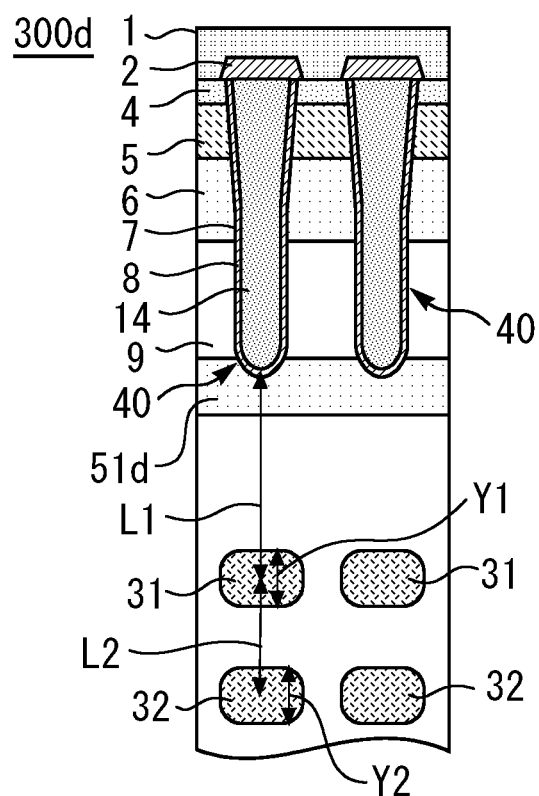
FIG. 41 is a cross-sectional view of a semiconductor device according to a third modification of the third embodiment.

FIG. 41 is a cross-sectional view of a semiconductor device 300d according to a third modification of the third embodiment. Of the adjacent active trench gates 40, an intermediate layer 51d below one active trench gate 40 and an intermediate layer 51d below the other active trench gate 40 may be connected to each other. The intermediate layers 51d are laterally connected to each other to form an intermediate layer 51d having a large area. This can further prevent the depletion layer of the first bottom layer 31 from extending to the trench 7 side. It is thus possible to further reduce the drop in the gate-collector capacitance Cgc and to reduce the collector-voltage tail. Moreover, with the high-concentration n type layer being disposed in the drift layer 9, a low-resistance current path can be formed. Therefore, the on-state voltage can be reduced.

Such a pattern of the intermediate layers 51d may be formed by performing implantation in a dot shape as illustrated in FIG. 5, and then performing diffusion in a lateral direction by thermal diffusion so that the intermediate layers 51d are connected to each other. The pattern of the intermediate layer 51d may be formed by performing implantation as a solid pattern like the carrier accumulation layer 6. The intermediate layer 51d has the same effect of reducing the on-state voltage as the carrier accumulation layer 6. Thus, the carrier accumulation layer 6 may not be formed.

Figure 42:
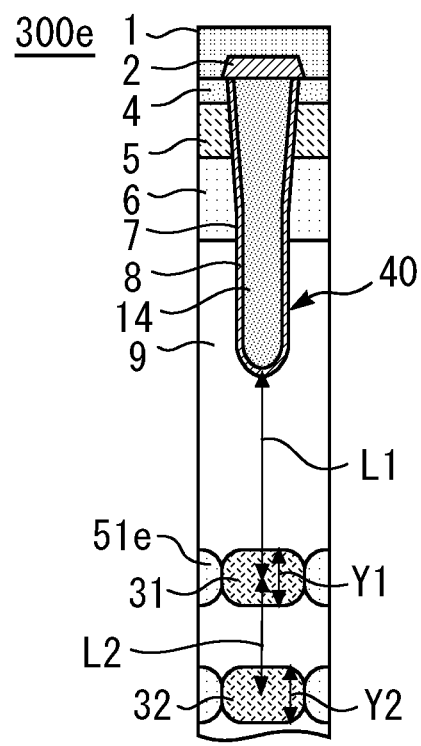
FIG. 42 is a cross-sectional view of a semiconductor device according to a fourth modification of the third embodiment.

FIG. 42 is a cross-sectional view of a semiconductor device 300e according to a fourth modification of the third embodiment. An intermediate layer 51e may be provided on the side of the first bottom layer 31. With such a configuration, the intermediate layer 51e can prevent the depletion layer from extending from the side of the first bottom layer 31 to the trench 7 side. It is thereby possible to reduce the drop in the gate-collector capacitance and to reduce the collector-voltage tail. Moreover, with the high-concentration n type layer being disposed in the drift layer 9, it is possible to form a low-resistance current path and to reduce the on-state voltage.

Figure 43:
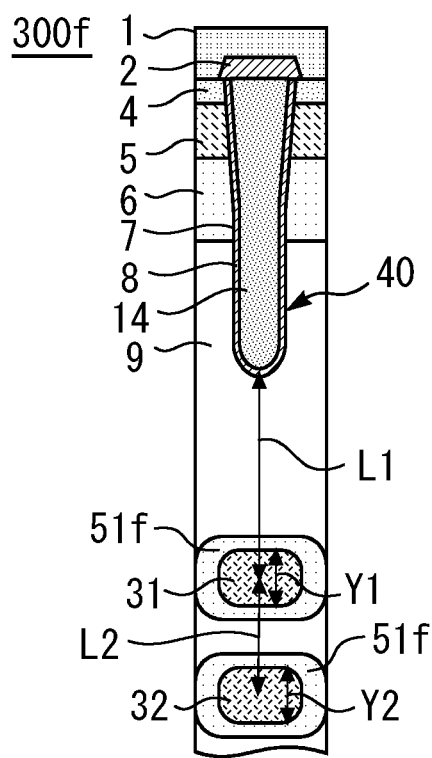
FIG. 43 is a cross-sectional view of a semiconductor device according to a fifth modification of the third embodiment.

FIG. 43 is a cross-sectional view of a semiconductor device 300f according to a fifth modification of the third embodiment. The first bottom layer 31 may be surrounded by an intermediate layer 51f. By the intermediate layer 51f being formed so as to cover the first bottom layer 31, the depletion layer can be further prevented from extending from the first bottom layer 31 to the trench 7 side. Hence it is possible to further reduce the drop in the gate-collector capacitance and to reduce the collector-voltage tail. Moreover, with the high-concentration n type layer being disposed in the drift layer 9, it is possible to form a low-resistance current path and to reduce the on-state voltage.

Fourth Embodiment

Figure 44:
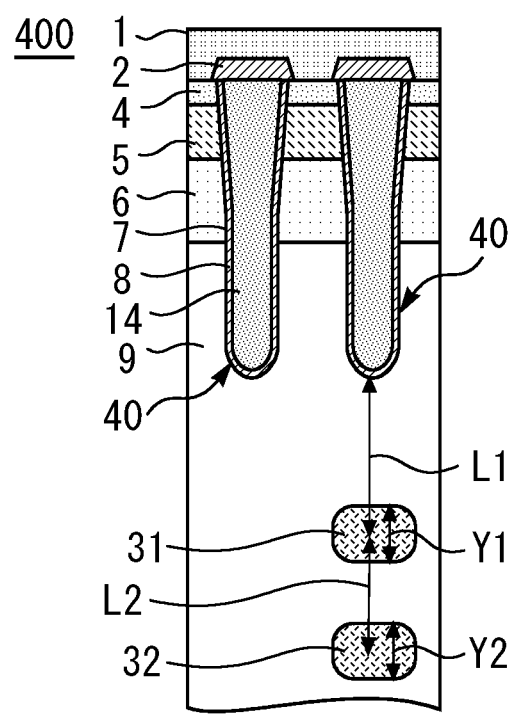
FIG. 44 is a cross-sectional view of the semiconductor device according to a fourth embodiment.

FIG. 44 is a cross-sectional view of the semiconductor device 400 according to a fourth embodiment. The semiconductor device 400 includes a plurality of active trench gates 40 electrically connected to the gate electrode 15. The plurality of active trench gates 40 include an active trench gate 40 provided with the first bottom layer 31 and the second bottom layer 32, and an active trench gate 40 provided with no bottom layer. The structure having no bottom layer at the bottom of the trench 7 and the structure having the bottom layers at the bottom of the trench 7 are alternately arranged, for example. In the trench 7 where no bottom layer is formed below, the influence of the bottom layer on the gate-collector capacitance Cgc can be prevented. Therefore, the collector-voltage tail can be reduced.

Figure 45:
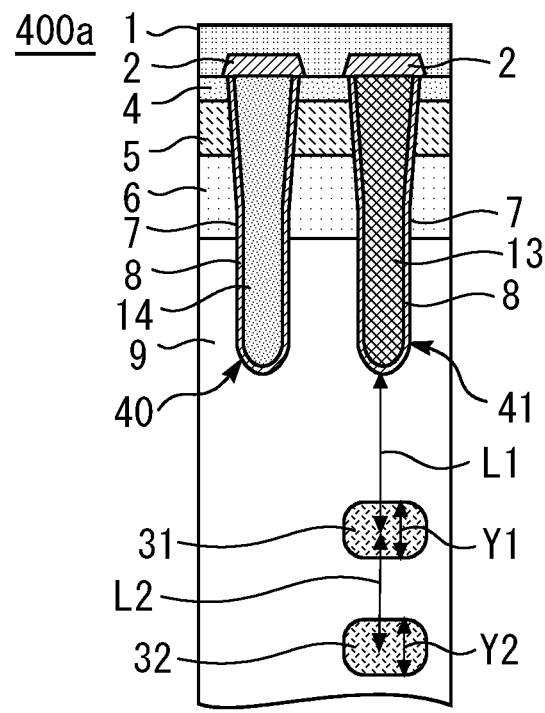
FIG. 45 is a cross-sectional view of a semiconductor device according to a first modification of the fourth embodiment.

FIG. 45 is a cross-sectional view of a semiconductor device 400a according to a first modification of the fourth embodiment. The semiconductor device 400a includes the active trench gate 40 electrically connected to the gate electrode 15, and the dummy trench gate 41 electrically connected to the emitter electrode 1. The first bottom layer 31 and the second bottom layer 32 are provided below the dummy trench gate 41 and are not provided below the active trench gate 40.

The dummy trench gate 41 is constituted by providing the dummy portion 13 in the trench 7 formed in the substrate via the gate oxide film 8. The dummy portion 13 is electrically connected to the emitter electrode 1. The dummy portion 13 is formed of polysilicon doped with n type or p type impurities.

In the semiconductor device 400a, the bottom layers are formed below the dummy trench gate 41 having no gate capacitance, and no bottom layer is formed below the active trench gate 40 having a gate capacitance. Thus, the influence of the bottom layer on the gate-collector capacitance Cgc can be prevented. Therefore, the collector-voltage tail can be reduced.

Fifth Embodiment

Figure 46:
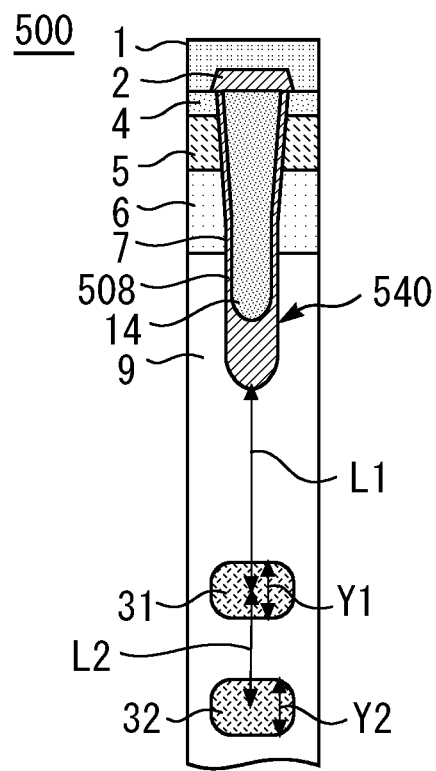
FIG. 46 is a cross-sectional view of a semiconductor device according to a fifth embodiment.

FIG. 46 is a cross-sectional view of a semiconductor device 500 according to a fifth embodiment. The peripheral portion of an active trench gate 540 is formed of a gate oxide film 508. A portion of the gate oxide film 508 forming the bottom of the active trench gate 540 is thicker than other portions of the gate oxide film 508. In the present embodiment, the bottom layer can relax the electric field, thereby reducing the dynamic avalanche. Further, the gate oxide film 508 having a thick bottom can reduce the injection of hot carriers. Hence it is possible to further prevent a deterioration in gate characteristics due to the dynamic avalanche.

Sixth Embodiment

Figure 47:
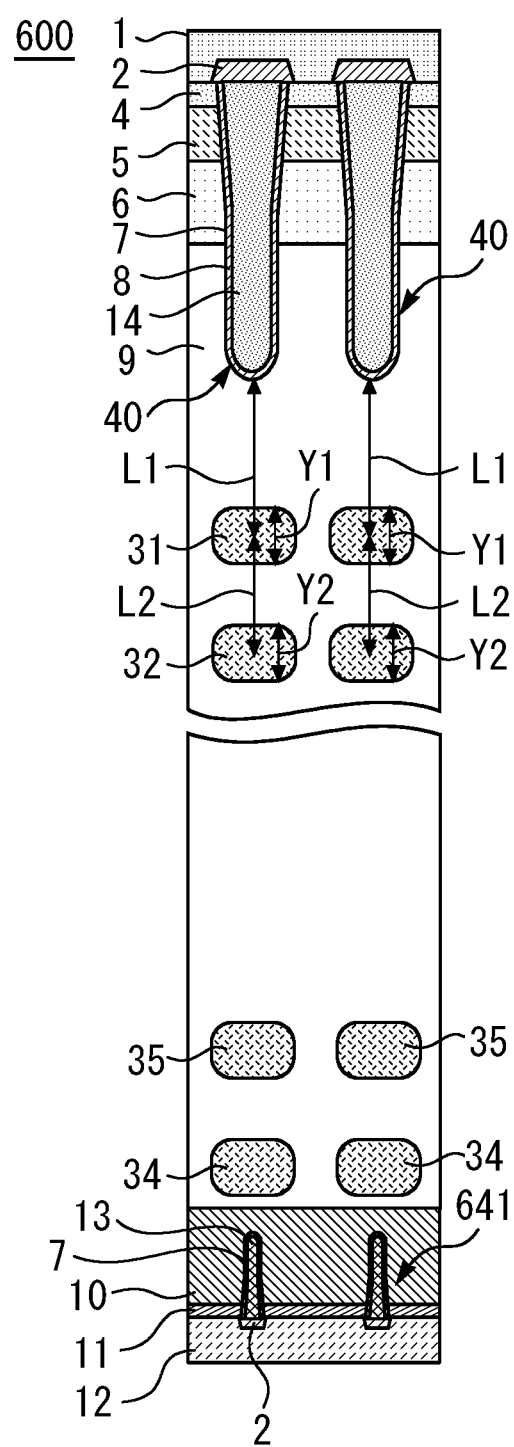
FIG. 47 is a cross-sectional view of a semiconductor device according to a sixth embodiment.

FIG. 47 is a cross-sectional view of a semiconductor device 600 according to a sixth embodiment. The semiconductor device 600 includes p type rear-side bottom layers 34, 35 provided on the rear surface side of the drift layer 9. The semiconductor device 600 includes a rear-side dummy trench gate 641 extending from the rear surface of the substrate to the buffer layer 10. The rear-side bottom layers 34, 35 are provided above the rear-side dummy trench gate 641.

The rear-side bottom layers 34, 35 are formed at positions deep from the rear surface of the substrate. The rear-side bottom layers 34, 35 can reduce the electric field on the rear surface side of the substrate. Therefore, the breakdown resistance can be improved.

In the example illustrated in FIG. 47, two rear-side bottom layers 34, 35 are provided for one trench 7. Alternatively, as in the first and second embodiments, one rear-side bottom layer or three or more rear-side bottom layers may be provided for one trench 7.

Figure 48:
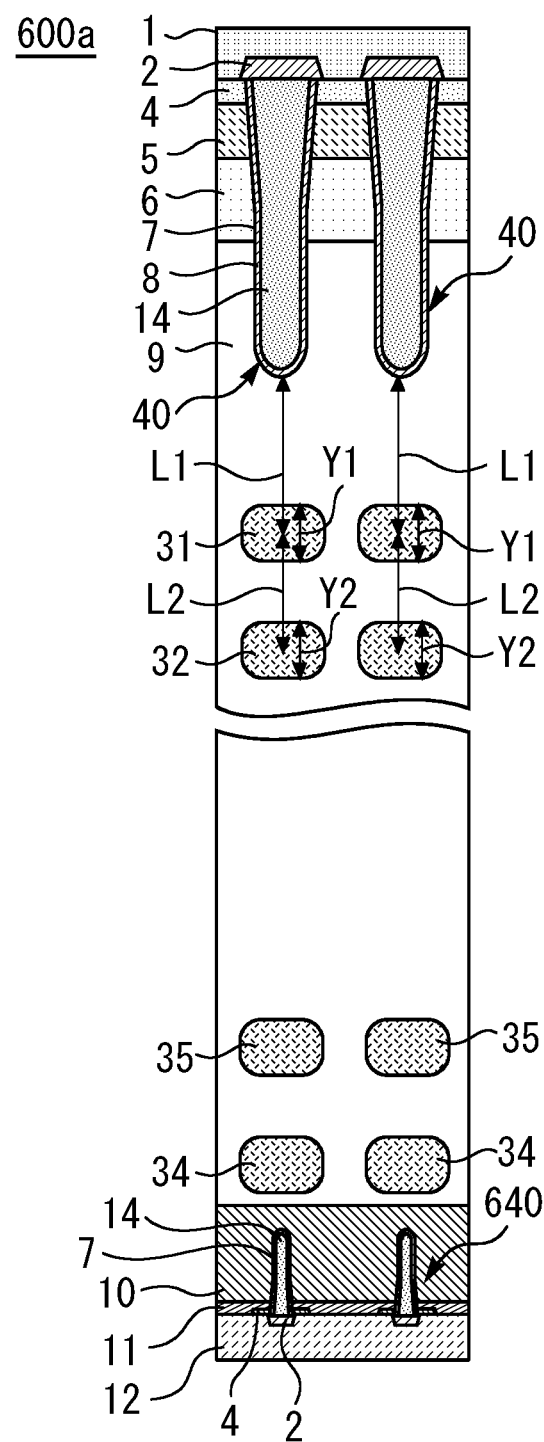
FIG. 48 is a cross-sectional view of a semiconductor device according to a modification of the sixth embodiment.

FIG. 48 is a cross-sectional view of a semiconductor device 600a according to a modification of the sixth embodiment. The semiconductor device 600a has a double-sided gate structure. In the double-sided gate structure, a cell structure is formed on the rear surface side of the substrate. The semiconductor device 600a includes a rear-side active trench gate 640 extending from the rear surface of the substrate to the buffer layer 10.

In the semiconductor device 600a, by controlling the rear-side active trench gate 640 and injecting electrons, the hole injection amount from the collector layer 11 can be controlled. For example, at the time of energization, the semiconductor device 600a can be turned on as a normal IGBT by turning off the rear-side active trench gate 640. At the time of turn-off, electrons are injected by turning on the rear-side active trench gate 640, whereby the hole density in the drift layer 9 can be reduced. It is thereby possible to greatly reduce the tail current at the time of turn-off and to reduce the turn-off loss.

The rear-side bottom layers 34, 35 may be applied to the rear-side active trench gate 640 as thus described. By applying the rear-side bottom layers 34, 35 in the double-sided gate structure, the electric field on the rear surface side of the substrate can be reduced. Therefore, the breakdown resistance can be improved.

Seventh Embodiment

Figure 49:
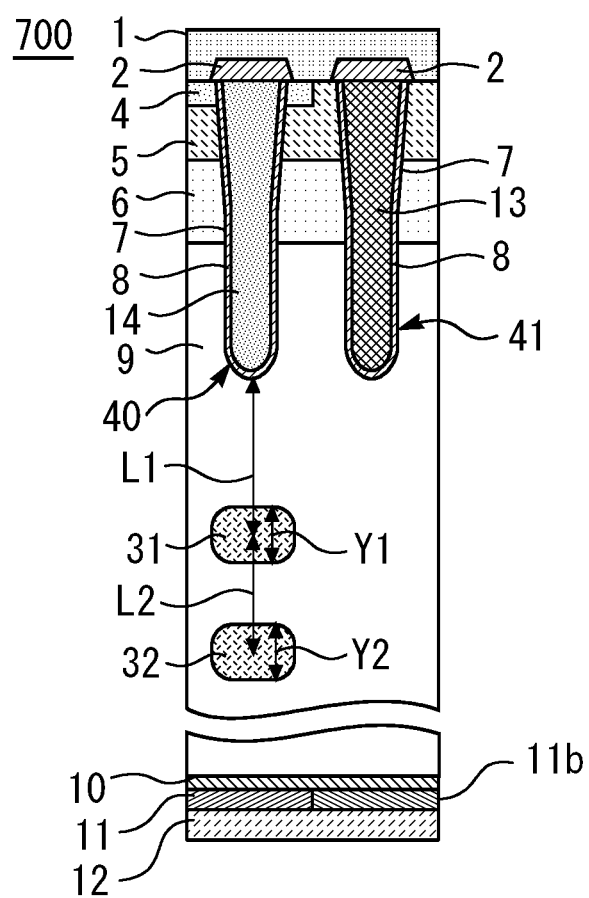
FIG. 49 is a cross-sectional view of a semiconductor device according to a seventh embodiment.

FIG. 49 is a cross-sectional view of a semiconductor device 700 according to a seventh embodiment. In the semiconductor device 700, a reverse conducting-IGBT (RC-IGBT) having an IGBT region and a diode region is formed on the substrate. In FIG. 49, a region where the collector layer 11 is provided on the rear surface side of the substrate is the IGBT region, and a region where a cathode layer 11b is provided is the diode region. In the diode region, the source layer 4 is not provided. The first bottom layer 31 and the second bottom layer 32 are not provided in the diode region. The active trench gate 40 is not provided in the diode region. In the example illustrated in FIG. 49, the dummy trench gate 41 is provided in the diode region.

No dynamic avalanche occurs in the diode region. This eliminates the need for electric field relaxation by the bottom layer. In the present embodiment, no bottom layer is provided in the diode region, so that it is possible to reduce the hole injection amount and to reduce recovery loss.

The technical features described in the foregoing embodiments can be used in various combinations as required.

In the semiconductor device according to the present disclosure, the first distance between the portion of the first bottom layer where the impurity concentration peaks in the thickness direction and the trench gate is larger than 1 µm. Hence it is possible to reduce the collector-voltage tail.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-001656, filed on Jan. 7, 2021 including specification, claims, drawings and summary, on which the Convention priority of the present application is based, are incorporated herein by reference in its entirety.

The invention claimed is:

1. A semiconductor device comprising:
   a substrate having an upper surface and a rear surface opposite to the upper surface;
   a drift layer of a first conductivity type provided on the substrate;
   a base layer of a second conductivity type different from the first conductivity type, the base layer being provided above the drift layer on the substrate;
   a source layer of the first conductivity type provided on an upper surface side of the base layer;
   a first electrode provided on the upper surface of the substrate and electrically connected to the source layer;
   a second electrode provided on the rear surface of the substrate;
   a gate electrode;
   a trench gate extending from the upper surface of the substrate to the drift layer through the source layer and the base layer, and electrically connected to the gate electrode or the first electrode; and
   a first bottom layer of the second conductivity type provided below the trench gate in the drift layer,
   wherein a first distance between a portion of the first bottom layer where an impurity concentration peaks in a thickness direction and the trench gate is larger than 1 µm.

2. The semiconductor device according to claim 1, wherein the first bottom layer is separated from the trench gate.

3. The semiconductor device according to claim 1, wherein the first distance is 3 µm or more.

4. The semiconductor device according to claim 1, wherein, when the impurity concentration of the first bottom layer is $10^{17}/cm^3$ or less, the first distance L1 and a thickness Y1 of the first bottom layer satisfy a relationship of $L1 \geq 1.95 \times Y1 + 3.62$.

5. The semiconductor device according to claim 1, wherein, when the impurity concentration of the first bottom layer is $5.0 \times 10^{16}/cm^3$ or less, the first distance L1 and the thickness Y1 of the first bottom layer satisfy a relationship of $L1 \geq 1.90 \times Y1 + 2.97$.

6. The semiconductor device according to claim 1, wherein, when the impurity concentration of the first bottom layer is $10^{16}/cm^3$ or less, the first distance L1 and the thickness Y1 of the first bottom layer satisfy a relationship of $L1 \geq 1.60 \times Y1 + 2.60$.

7. The semiconductor device according to claim 1, wherein, when the impurity concentration of the first bottom layer is $5.0 \times 10^{15}/cm^3$ or less, the first distance L1 and the thickness Y1 of the first bottom layer satisfy a relationship of $L1 \geq 1.30 \times Y1 + 2.34$.

8. The semiconductor device according to claim 1, wherein, when the impurity concentration of the first bottom layer is $10^{15}/cm^3$ or less, the first distance L1 and the thickness Y1 of the first bottom layer satisfy a relationship of $L1 \geq 2.38 \times Y1 + 0.05$.

9. The semiconductor device according to claim 1, wherein when the impurity concentration of the first bottom layer is $10^{17}/cm^3$ or more, the first distance L1 and the thickness Y1 of the first bottom layer satisfy a relationship of $L1 > 1.95 \times Y1 + 3.62$.

10. The semiconductor device according to claim 1, further comprising
a second bottom layer of the second conductivity type provided below the first bottom layer in the drift layer.

11. The semiconductor device according to claim 10, further comprising
a third bottom layer of the second conductivity type provided below the second bottom layer in the drift layer.

12. The semiconductor device according to claim 11, wherein
the impurity concentration of the first bottom layer is lower than an impurity concentration of the second bottom layer, and
the impurity concentration of the second bottom layer is lower than an impurity concentration of the third bottom layer.

13. The semiconductor device according to claim 11, wherein
the impurity concentration of the first bottom layer is lower than an impurity concentration of the third bottom layer, and
the impurity concentration of the third bottom layer is lower than an impurity concentration of the second bottom layer.

14. The semiconductor device according to claim 11, wherein
the impurity concentration of the first bottom layer is higher than an impurity concentration of the second bottom layer, and
the impurity concentration of the second bottom layer is higher than an impurity concentration of the third bottom layer.

15. The semiconductor device according to claim 11, wherein
the impurity concentration of the first bottom layer is higher than an impurity concentration of the third bottom layer, and
the impurity concentration of the third bottom layer is higher than an impurity concentration of the second bottom layer.

16. The semiconductor device according to claim 11, wherein a second distance between a portion of the second bottom layer where an impurity concentration peaks in the thickness direction and the portion of the first bottom layer where the impurity concentration peaks in the thickness direction is larger than a third distance between the portion of the second bottom layer where the impurity concentration peaks in the thickness direction and a portion of the third bottom layer where an impurity concentration peaks in the thickness direction.

17. The semiconductor device according to claim 16, wherein the second bottom layer and the third bottom layer are in contact with each other.

18. The semiconductor device according to claim 11, wherein a second distance between a portion of the second bottom layer where an impurity concentration peaks in the thickness direction and the portion of the first bottom layer where the impurity concentration peaks in the thickness direction is smaller than a third distance between the portion of the second bottom layer where the impurity concentration peaks in the thickness direction and a portion of the third bottom layer where an impurity concentration peaks in the thickness direction.

19. The semiconductor device according to claim 18, wherein the first bottom layer and the second bottom layer are in contact with each other.

20. The semiconductor device according to claim 11, wherein
the thickness of the first bottom layer is smaller than a thickness of the second bottom layer, and
the thickness of the second bottom layer is smaller than a thickness of the third bottom layer.

21. The semiconductor device according to claim 20, wherein a width of the first bottom layer is smaller than a width of the second bottom layer.

22. The semiconductor device according to claim 11, wherein
the thickness of the first bottom layer is smaller than a thickness of the third bottom layer, and
the thickness of the third bottom layer is smaller than a thickness of the second bottom layer.

23. The semiconductor device according to claim 11, wherein
the thickness of the first bottom layer is larger than a thickness of the second bottom layer, and
the thickness of the second bottom layer is larger than a thickness of the third bottom layer.

24. The semiconductor device according to claim 23, wherein a width of the first bottom layer is larger than a width of the second bottom layer.

25. The semiconductor device according to claim 11, wherein
the thickness of the first bottom layer is larger than a thickness of the third bottom layer, and
the thickness of the third bottom layer is larger than a thickness of the second bottom layer.

26. The semiconductor device according to claim 10, wherein the first bottom layer and the second bottom layer are separated from each other.

27. The semiconductor device according to claim 26, wherein an interval between the first bottom layer and the second bottom layer is larger than the thickness of the first bottom layer.

28. The semiconductor device according to claim 10, wherein the first distance is larger than a second distance between a portion of the second bottom layer where an impurity concentration peaks in the thickness direction and the portion of the first bottom layer where the impurity concentration peaks in the thickness direction.

29. The semiconductor device according to claim 10, wherein a second distance between a portion of the second bottom layer where an impurity concentration peaks in the thickness direction and the portion of the first bottom layer where the impurity concentration peaks in the thickness direction is larger than the first distance.

30. The semiconductor device according to claim 10, wherein the impurity concentration of the first bottom layer is lower than an impurity concentration of the second bottom layer.

31. The semiconductor device according to claim 10, wherein the thickness of the first bottom layer is smaller than a thickness of the second bottom layer.

32. The semiconductor device according to claim 1, wherein the first bottom layer is connected to a first bottom layer below another trench gate adjacent to the trench gate.

33. The semiconductor device according to claim 32, wherein the first bottom layer is interrupted in a direction intersecting in plan view with a direction in which the trench gate and the other trench gate are arranged.

34. The semiconductor device according to claim 1, further comprising
an intermediate layer that is provided between the first bottom layer and the trench gate or on a side of the first bottom layer, is of the first conductive type, and has a higher concentration than a concentration of the drift layer.

35. The semiconductor device according to claim 34, wherein an impurity concentration of the intermediate layer is higher than the impurity concentration of the first bottom layer.

36. The semiconductor device according to claim 34, wherein the intermediate layer is provided between the first bottom layer and the trench gate and is separated from the first bottom layer.

37. The semiconductor device according to claim 34, wherein the intermediate layer is provided between the first bottom layer and the trench gate and is away from the trench gate.

38. The semiconductor device according to claim 34, wherein the intermediate layer is connected to an intermediate layer below another trench gate adjacent to the trench gate.

39. The semiconductor device according to claim 34, wherein the first bottom layer is surrounded by the intermediate layer.

40. The semiconductor device according to claim 1, further comprising
a plurality of trench gates electrically connected to the gate electrode,
wherein the plurality of trench gates include
a trench gate provided with the first bottom layer, and
a trench gate not provided with the first bottom layer.

41. The semiconductor device according to claim 1, wherein
the trench gate includes
an active trench gate electrically connected to the gate electrode, and
a dummy trench gate electrically connected to the first electrode, and
the first bottom layer is provided below the dummy trench gate and is not below the active trench gate.

42. The semiconductor device according to claim 1, wherein
a peripheral portion of the trench gate is formed of an oxide film, and
a portion of the oxide film forming a bottom of the trench gate is thicker than other portions of the oxide film.

43. The semiconductor device according to claim 1, further comprising
a rear-side bottom layer of the second conductivity type provided on a rear surface side of the drift layer.

44. The semiconductor device according to claim 43, further comprising
a rear-side trench gate extending from the rear surface of the substrate to the drift layer,
wherein the rear-side bottom layer is provided above the rear-side trench gate.

45. The semiconductor device according to claim 1, wherein an IGBT is formed on the substrate.

46. The semiconductor device according to claim 1, wherein
a RC-IGBT having an IGBT region and a diode region is formed on the substrate, and
the first bottom layer is not provided on the diode region.

47. The semiconductor device according to claim 1, wherein a MOSFET is formed on the substrate.

48. The semiconductor device according to claim 1, wherein the substrate is made with a wide bandgap semiconductor.

49. The semiconductor device according to claim 48, wherein the wide bandgap semiconductor is silicon carbide, gallium nitride-based material, or diamond.

* * * * *